US011688780B2

(12) United States Patent
Mehandru et al.

(10) Patent No.: US 11,688,780 B2
(45) Date of Patent: Jun. 27, 2023

(54) DEEP SOURCE AND DRAIN FOR TRANSISTOR STRUCTURES WITH BACK-SIDE CONTACT METALLIZATION

(71) Applicant: Intel Corporation, Santa Clara, CA (US)

(72) Inventors: Rishabh Mehandru, Portland, OR (US); Tahir Ghani, Portland, OR (US); Stephen Cea, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 852 days.

(21) Appl. No.: 16/362,510

(22) Filed: Mar. 22, 2019

(65) Prior Publication Data

US 2020/0303509 A1  Sep. 24, 2020

(51) Int. Cl.
*H01L 29/417* (2006.01)
*H01L 29/78* (2006.01)
(Continued)

(52) U.S. Cl.
CPC ...... *H01L 29/41791* (2013.01); *H01L 23/481* (2013.01); *H01L 27/0886* (2013.01); *H01L 29/0615* (2013.01); *H01L 29/0847* (2013.01); *H01L 29/401* (2013.01); *H01L 29/4175* (2013.01); *H01L 29/456* (2013.01); (Continued)

(58) Field of Classification Search
CPC ............. H01L 23/481; H01L 27/0886; H01L 29/0615; H01L 29/4175; H01L 29/41791; H01L 29/45; H01L 29/456; H01L 29/66492; H01L 29/66795; H01L 29/7833; H01L 29/785; H01L 2029/7858
See application file for complete search history.

(56) References Cited

U.S. PATENT DOCUMENTS 5,355,022 A   10/1994  Sugahara et al.
5,869,867 A    2/1999  Takeuchi
(Continued)

FOREIGN PATENT DOCUMENTS

CN         1309077 C     4/2007
CN        105448998      3/2016
(Continued)

*Primary Examiner* — Herve-Louis Y Assouman
*Assistant Examiner* — Christopher M Roland
(74) *Attorney, Agent, or Firm* — Essential Patents Group, LLP

(57) ABSTRACT

Transistor structure including deep source and/or drain semiconductor that is contacted by metallization from both a front (e.g., top) side and a back (e.g., bottom) side of transistor structure. The deep source and/or drain semiconductor may be epitaxial, following crystallinity of a channel region that may be monocrystalline A first layer of the source and/or drain semiconductor may have lower impurity doping while a second layer of the source and/or drain semiconductor may have higher impurity doping. The deep source and/or drain semiconductor may extend below the channel region and be adjacent to a sidewall of a sub-channel region such that metallization in contact with the back side of the transistor structure may pass through a thickness of the first layer of the source and/or drain semiconductor to contact the second layer of the source and/or drain semiconductor.

13 Claims, 12 Drawing Sheets

(51) Int. Cl.
  *H01L 27/088* (2006.01)
  *H01L 29/08* (2006.01)
  *H01L 29/45* (2006.01)
  *H01L 23/48* (2006.01)
  *H01L 29/40* (2006.01)
  *H01L 29/66* (2006.01)
  *H01L 29/06* (2006.01)

(52) U.S. Cl.
  CPC .. *H01L 29/66492* (2013.01); *H01L 29/66795* (2013.01); *H01L 29/785* (2013.01); *H01L 29/7833* (2013.01); *H01L 2029/7858* (2013.01)

(56) References Cited

U.S. PATENT DOCUMENTS

| | | |
|---|---|---|
| 6,424,020 B1 | 7/2002 | Vu et al. |
| 6,455,398 B1 | 9/2002 | Fonstad et al. |
| 6,605,951 B1 | 8/2003 | Cowan |
| 6,627,953 B1 | 9/2003 | Vu et al. |
| 7,091,534 B2 | 8/2006 | Koyanagi |
| 7,402,866 B2 | 7/2008 | Liang et al. |
| 7,825,472 B2 | 11/2010 | Park et al. |
| 8,018,008 B2 | 9/2011 | Ozoe |
| 8,084,795 B2 | 12/2011 | Pan |
| 8,354,675 B2 | 1/2013 | Kwon et al. |
| 8,395,191 B2 | 3/2013 | Or-Bach et al. |
| 8,426,888 B2 | 4/2013 | Molin |
| 9,129,926 B2 | 9/2015 | Koo et al. |
| 9,171,887 B2 | 10/2015 | Yokoyama |
| 9,184,136 B2 | 11/2015 | Kim et al. |
| 9,305,834 B1 | 4/2016 | Latypov et al. |
| 9,385,195 B1 | 7/2016 | Zhang |
| 9,412,788 B2 | 8/2016 | Yokoyama et al. |
| 9,450,075 B2 | 9/2016 | Huang |
| 9,640,531 B1 | 5/2017 | Or-Bach et al. |
| 9,786,783 B2 | 10/2017 | Hafez et al. |
| 9,818,856 B2 | 11/2017 | Hoshi et al. |
| 9,929,133 B2 | 3/2018 | Lin et al. |
| 10,420,171 B2 | 9/2019 | Goktepeli |
| 10,790,281 B2 | 9/2020 | Mehandru et al. |
| 2001/0041407 A1 | 11/2001 | Brown |
| 2004/0119165 A1 | 6/2004 | Baukus et al. |
| 2005/0151276 A1 | 7/2005 | Jang et al. |
| 2006/0115943 A1 | 6/2006 | Koyanagi |
| 2007/0001219 A1 | 1/2007 | Radosavljevic et al. |
| 2007/0296002 A1 | 12/2007 | Liang et al. |
| 2008/0179678 A1 | 7/2008 | Dyer et al. |
| 2009/0152611 A1 | 6/2009 | Fujimoto |
| 2009/0166677 A1 | 7/2009 | Shibata et al. |
| 2011/0241073 A1 | 10/2011 | Cohen et al. |
| 2012/0043663 A1 | 2/2012 | Ko et al. |
| 2012/0088339 A1 | 4/2012 | Molin et al. |
| 2013/0126981 A1* | 5/2013 | Ho .................. H01L 29/7851 |
| | | 257/E27.06 |
| 2013/0130479 A1 | 5/2013 | Stube et al. |
| 2013/0134585 A1 | 5/2013 | Stuber et al. |
| 2013/0162346 A1 | 6/2013 | McElvain et al. |
| 2014/0054685 A1 | 2/2014 | Consentino et al. |
| 2014/0210058 A1 | 7/2014 | Lee et al. |
| 2014/0231874 A1 | 8/2014 | Hoshi et al. |
| 2014/0264632 A1 | 9/2014 | Richter et al. |
| 2014/0332749 A1 | 11/2014 | Yokoyama |
| 2015/0028289 A1 | 1/2015 | Hekmatshoartabari |
| 2015/0061020 A1 | 3/2015 | Yokoyama et al. |
| 2015/0061026 A1 | 3/2015 | Lin et al. |
| 2015/0069520 A1 | 3/2015 | Lee |
| 2015/0129891 A1 | 5/2015 | Lin et al. |
| 2015/0137224 A1 | 5/2015 | Meiser et al. |
| 2015/0137842 A1 | 5/2015 | Murakami et al. |
| 2015/0206936 A1 | 7/2015 | Huang |
| 2015/0235949 A1 | 8/2015 | Yu et al. |
| 2015/0280010 A1 | 10/2015 | Shieh et al. |
| 2015/0318381 A1* | 11/2015 | Tsai .................. H01L 29/7833 |
| | | 438/283 |
| 2015/0347659 A1 | 12/2015 | Chiang et al. |
| 2015/0357425 A1 | 12/2015 | Liu et al. |
| 2015/0380305 A1 | 12/2015 | Basker et al. |
| 2016/0043083 A1 | 2/2016 | Kawa et al. |
| 2016/0093629 A1 | 3/2016 | Wang |
| 2016/0095221 A1 | 3/2016 | Ramachandran et al. |
| 2016/0197069 A1 | 7/2016 | Morrow et al. |
| 2016/0247887 A1 | 8/2016 | Jun et al. |
| 2016/0307996 A1 | 10/2016 | Meiser et al. |
| 2016/0351492 A1 | 12/2016 | Watanabe et al. |
| 2018/0197895 A1 | 7/2018 | Liu |
| 2019/0057959 A1 | 2/2019 | Or-Bach et al. |
| 2019/0259699 A1* | 8/2019 | Morrow .............. H01L 29/401 |
| 2020/0373301 A1* | 11/2020 | Kim .................. H01L 23/5286 |
| 2021/0336012 A1* | 10/2021 | Huang ............. H01L 21/76897 |
| 2021/0391325 A1* | 12/2021 | Su .................... H01L 21/3086 |

FOREIGN PATENT DOCUMENTS

| | | |
|---|---|---|
| EP | 1624487 | 2/2006 |
| EP | 1638142 | 3/2006 |
| JP | H05198739 | 8/1993 |
| JP | H09260669 | 3/1997 |
| JP | 2009295961 | 12/2009 |
| JP | 2014220376 | 11/2014 |
| JP | 2014170940 | 3/2017 |
| KR | 1020100106702 | 10/2010 |
| TW | 201642474 | 12/2016 |
| TW | 201729423 | 8/2017 |
| WO | 2013004836 | 1/2013 |
| WO | 2013166116 | 11/2013 |
| WO | 2017052562 | 3/2017 |
| WO | 2017052626 | 3/2017 |
| WO | 2018031175 | 2/2018 |
| WO | WO-2018063302 A1 * | 4/2018 ....... H01L 21/76898 |

* cited by examiner

DEEP SOURCE AND DRAIN FOR TRANSISTOR STRUCTURES WITH BACK-SIDE CONTACT METALLIZATION

BACKGROUND

Device density in integrated circuits (ICs) has increased for decades in conformance with Moore's law. However, as the lateral dimensions of a device structure shrink with each technology generation, it becomes increasingly difficult to further reduce structural dimensions.

Three-dimensional (3D) scaling is now of considerable interest as reductions in z-height (device thickness) offer another avenue of increasing overall device density and IC performance. 3D scaling may be in the form of chip stacking or packaged IC stacking, for example. Known 3D integration techniques are expensive and may offer only incremental improvements in z-height and device density. For example, the majority of the thickness of an IC chip may be inactive substrate material.

One form of 3D chip scaling comprises interconnect metallization on opposite sides of a device layer that includes a semiconductor material, such as monocrystalline silicon. However, integrating back-side interconnect metallization poses challenges as many of the transistor-level structures are built up from a front side of the substrate so that access to a back side of the structures may need to deviate significantly from front-side access. In some instances, for example, a back-side contact to a source and/or drain portion of a transistor can display higher contact resistance than a front-side contact. As such, techniques and architectures that achieve low contact resistance for back-side contact metallization would be advantageous at least from a transistor and/or chip performance standpoint.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
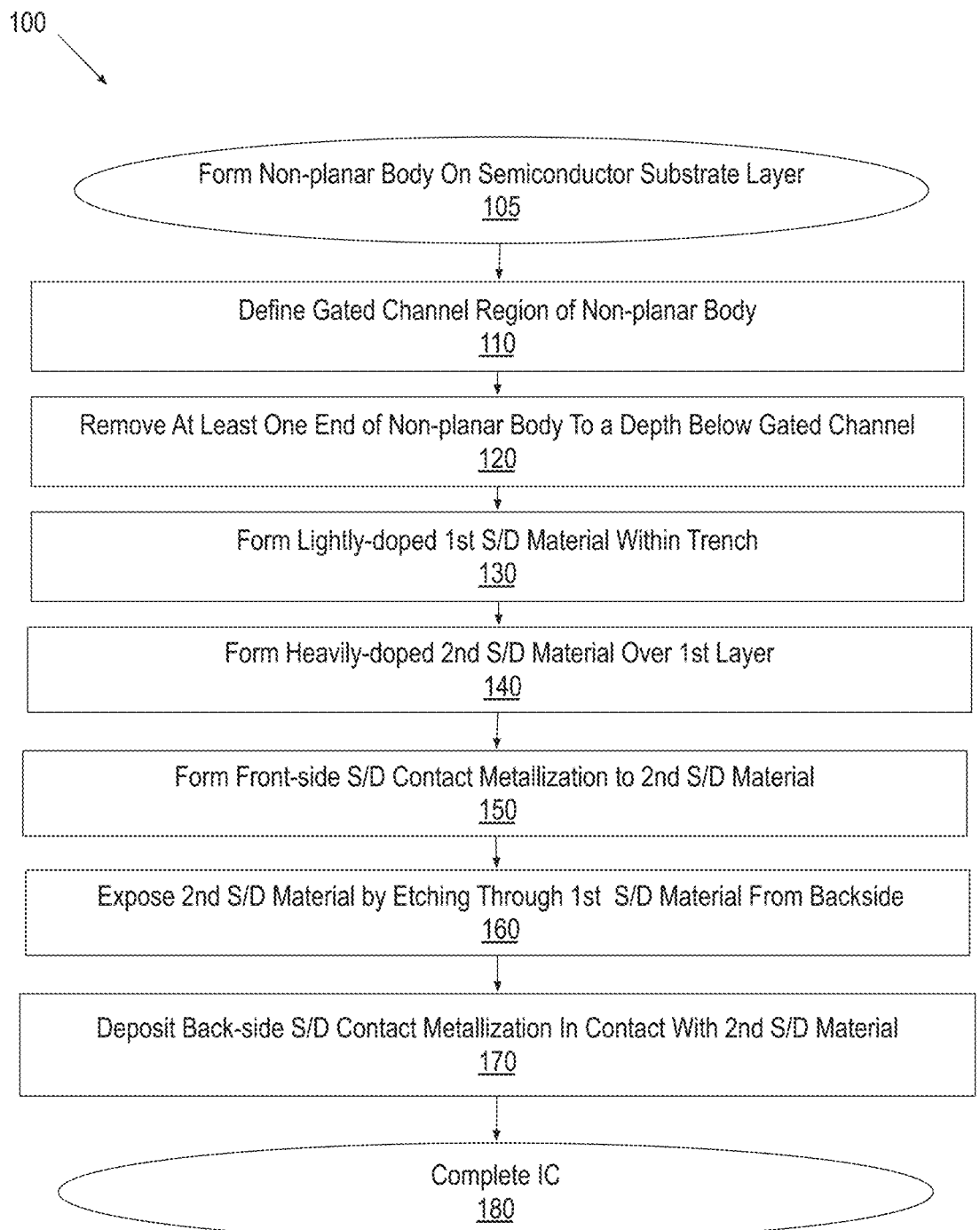
FIG. 1 is a flow diagram illustrating methods of forming a transistor structure with a deep source and/or drain and back-side contact metallization, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment"

or "some embodiments" means that a particular feature, structure, function, or characteristic described in connection with the embodiment is included in at least one embodiment. Thus, the appearances of the phrase "in an embodiment" or "in one embodiment" or "in some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material disposed over or under another may be directly in contact or may have one or more intervening materials. Moreover, one material disposed between two materials may be directly in contact with the two layers or may have one or more intervening layers. In contrast, a first material or materials "on" a second material or materials is in direct contact with that second material/materials. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

IC device structures and fabrication techniques employing back-side processing of device structures are described herein. In addition to front-side processing typically employed in the fabrication of IC device structures, back-side processing of IC device fabricates double-sided device structures. Double-sided processing may further entail atypical front-side processing designed to facilitate the back-side processing. In some exemplary embodiments, double-side processing comprises a reveal of a back side of front-side device structures.

Within an IC, a device layer can contain active devices or passive devices. In some embodiments, the device layer comprises a semiconductor material that is employed by an IC device. In specific embodiments, the device layer is a monocrystalline semiconductor material as such material often offers device performance advantages over polycrystalline or amorphous thin film semiconductor materials. As one example, in a transistor device, such as a field effect transistor (FET), the transistor channel is formed from the semiconductor device layer. As another example, for an optical device, such as a photodiode, the drift and/or gain semiconductor is formed from the device layer. The device layer may also be employed in a passive structure with an IC device. For example, an optical waveguide may employ semiconductor patterned from the device layer.

Although finFET structures having multiple semiconductor/gate interfaces are described in detail herein, the structures and/or techniques described in the context of finFET structures may be readily applied to planar transistors (e.g., that have only a top-side semiconductor/gate interface) as well as nanowire transistors (e.g., having gate that completely encompasses a filament of semiconductor). Also, although the finFET structures described in detail are metal-oxide-semiconductor (MOS) structures, the structures and/or techniques described in the context of MOSFET structures may be readily applied to other transistor types, such as, but not limited to other FET architectures, bipolar junction transistors, or other devices including one or more semiconductor junctions (e.g., diodes, etc.).

As described further below, a transistor structure may include a deep source and/or a deep drain semiconductor that is contacted by metallization on a back (e.g., bottom) side of transistor structure. The deep source and/or drain semiconductor may be contacted also by metallization on a front (e.g., top) side. The deep source and/or drain semiconductor may be epitaxial, following crystallinity of a channel region of the transistor structure. The deep source and/or drain semiconductor may extend to a depth below the channel region to be adjacent to both a sidewall of the channel region and a sidewall of an underlying sub-channel region that is not electrically coupled to a gate electrode.

A first layer of the source and/or drain semiconductor having a lower impurity doping may be in contact with the sidewalls of the channel region and sub-channel region while a second layer of the source and/or drain semiconductor having a higher impurity doping is over the first layer. While metallization contacting a front side of the transistor structure may be directly to the second layer of source and/or drain semiconductor, metallization contacting the back side of the transistor structure instead passes through a thickness of the first layer of the source and/or drain semiconductor at a depth of the sub-channel region to make contact to the second layer of the source and/or drain semiconductor. With sufficient source and/or drain semiconductor depth, the metallization need not exclusively contact the first layer of source and/or drain semiconductor, which might display higher resistance and/or non-ohmic (e.g., Schottky) characteristics, but instead make contact with the more heavily doped semiconductor thereby ensuring lower contact resistance between the metallization and the source and/or drain semiconductor.

FIG. 1 is a flow diagram illustrating methods 100 for forming a transistor structure with a deep source and/or drain and back-side contact metallization, in accordance with some embodiments. Methods 100 begin at block 105 where one or more non-planar bodies (e.g., fins) are formed from a semiconductor material layer of a substrate. The substrate may be a wafer of any diameter (e.g., 300 mm, 450 mm, etc.). The semiconductor material layer may be a portion of a bulk semiconductor substrate or may be a top layer of a semiconductor-on-insulator (SOI) substrate, for example. The semiconductor material layer may be masked and then etched, for example with any etch process known to be suitable for the semiconductor material layer, to define non-planar bodies having some transverse width and longitudinal length. The non-planar body etch may stop on an isolation dielectric that surrounds the bodies, or the non-planar body etch may be timed and an isolation dielectric subsequently deposited around the bodies.

At block 110, a channel region that is operable to be electrically gated by a gate electrode (e.g., through the field effect) is defined within a non-planar body. The channel region may be defined according to a number of different techniques, including "gate-first" techniques where a permanent gate stack is formed followed by the formation of source and drain regions, and "gate-last" techniques where a permanent gate stack is formed after the formation of source and drain regions. Some exemplary gate-last techniques utilize a sacrificial gate stack to define the channel region prior to the formation of source and drain regions, and then the sacrificial gate stack is replaced with a permanent gate stack. Nevertheless, at block 110 a channel region is defined, for example with either a sacrificial or permanent gate stack. In some exemplary finFET embodiments, the channel region defined at block 110 includes a semiconductor material sidewall of a fin. A gate electrode structure defining the channel region at block 110 may, for example, extend over isolation dielectric adjacent to a fin sidewall.

At block 120, a region of a non-planar body formed at block 105 that is not part of the channel region defined at block 110, or otherwise masked, is removed to expose at least one end sidewall of the channel region, and also to expose at least one end sidewall of a sub-channel region that underlies the channel region. In some exemplary embodiments, two opposite ends of the non-planar body formed at block 105 are removed to expose two opposite ends of the channel region and sub-channel region. In other embodiments where only one end of a sub-channel region is exposed, the opposite end of the non-planar body formed at block 105 is etched to a lesser extent, for example exposing a sidewall of the channel region, but not exposing a sidewall of the sub-channel region.

The sub-channel region may be part of the same substrate material layer as the channel region, or not. Regardless, unlike the channel region, the sub-channel region is not operable to be electrically gated by a field effect associated with a bias voltage carried by the gate electrode. As noted further below, the recess etch performed at block 120 may be deep enough into the sub-channel region to ensure that a sidewall of the channel region is sufficiently steep (e.g., greater than 70 degrees) and that a sidewall of a significant thickness of the sub-channel region is also sufficiently steep (e.g., greater than 70 degrees).

Methods 100 continue at block 130 where lightly-doped source and/or drain (LDD) semiconductor material is formed. The lightly-doped semiconductor material may have an impurity concentration significantly greater than that of the channel region, which is advantageously minimal for greatest carrier velocities, etc. The lightly-doped semiconductor material may be deposited with any technique known to be suitable for any chosen material composition with the impurity dopant advantageously incorporated in-situ to the deposition rather than ex-situ (e.g., through subsequent species implantation). In some advantageous embodiments where at least the channel region is substantially monocrystalline, the lightly-doped semiconductor material formed at block 130 is epitaxially grown to have a crystallinity dependent on that of the channel region. For example, structure and orientation of the crystalline lightly-doped semiconductor material may be substantially the same as, or otherwise indicative of, the structure and orientation of the crystalline channel region semiconductor. An adequately steep sidewall slope over the channel region and at least some portion of sub-channel region may ensure the lightly doped semiconductor material has a well-controlled layer thickness as measured from the sidewall of the channel region and/or sub-channel region.

At block 140, heavily-doped source and/or drain semiconductor material is then formed over the lightly-doped source and/or drain semiconductor material. In some embodiments, the heavily-doped source and/or drain semiconductor material is epitaxially grown with the lightly-doped source and/or drain semiconductor material providing a nucleation layer for the epitaxial growth of the heavily-doped material. The heavily-doped material may have a higher impurity dopant concentration than the lightly-doped semiconductor material. The impurity dopant may be advantageously incorporated in-situ to the deposition rather than ex-situ (e.g., through subsequent species implantation).

At block 150, source and/or drain contact metallization is fabricated to make electrical contact with a front side of the source and/or drain semiconductor. Any contact metallization composition may be formed at block 150 according to any fabrication technique suitable for the materials employed. In some embodiments, a contact opening or via is formed through a dielectric material overlying the source and/or drain semiconductor. The contact via may expose a portion of the heavily-doped source and/or drain semiconductor, for example, since the heavily-doped material was deposited and/or grown over the lightly-doped semiconductor material. The high impurity concentration of the heavily-doped semiconductor may form a low resistance metal-semiconductor contact junction with the contact metallization.

Methods 100 continue at block 160, where a back-side of at least a portion of the source and/or drain semiconductor is exposed, for example with a back-side contact or via etch process that is performed, for example after a front-side of a workpiece (e.g., wafer) has been bonded to a carrier and the workpiece thinned from the back side. In some embodiments, contact openings or vias are formed through a dielectric material that is deposited over a back side of the source and/or drain semiconductor material following a back-side grind and/or polish. The contact vias may first expose a portion of the lightly-doped source and/or drain semiconductor, for example, since the heavily-doped material was deposited and/or grown over the lightly-doped semiconductor material. In some exemplary embodiments, the back-side via etch further includes etching through the lightly-doped source and/or drain semiconductor material that is contacting the heavily-doped source and/or drain semiconductor material. With the source and/or drain semiconductor having sufficient depth below the channel-to-sub-channel interface, the back-side via etch can target a semiconductor etch depth that is sufficient to clear the thickness of the lightly-doped source and/or drain semiconductor so that the heavily-doped semiconductor material is exposed at a bottom of the back-side via.

At block 170, source and/or drain contact metallization is deposited to make electrical contact with a back side of the heavily-doped source and/or drain semiconductor material. Any contact metallization composition may be formed at block 170 according to any fabrication technique suitable for the materials employed. In some embodiments, the contact metallization composition formed at block 170 is the same as that of the front-side contact metallization formed at block 150. The high impurity concentration of the heavily-doped semiconductor may form a low resistance metal-semiconductor contact junction with the back-side contact metallization.

Methods 100 then continue at block 180 where an integrated circuit includes a device layer that further includes one or more of the transistor structures fabricated in blocks 105-170. In some embodiments, block 180 includes the formation of one or more levels of back-side interconnect that electrically interconnect the back-side contact metallization to various circuit nodes of an IC. In some embodiments, block 180 includes the formation of one or more levels of front-side interconnect that electrically interconnect the front-side contact metallization to various circuit nodes of an IC. Notably, block 180 may be implemented with any number of fabrication techniques, any one of which may be practiced before or after various ones of blocks 105-170. Hence, the illustrated ordering of the blocks 105-170 is not required by all embodiments and/or various additional blocks may be interspersed within blocks 105-170 as needed to arrive at an IC that has at least back-side metallization over and below a device layer comprising the transistor structures formed according to methods 100.

Transistor structures in accordance with some exemplary embodiments are further described below. Attributes and features of the transistor structures described can be fabricated through the practice of methods 100, for example. However, other fabrication techniques may also be employed to arrive at the transistor structures described herein, so the transistor structures illustrated for the sake of further explanation do not necessarily mandate the practice of methods 100.

Figure 2:
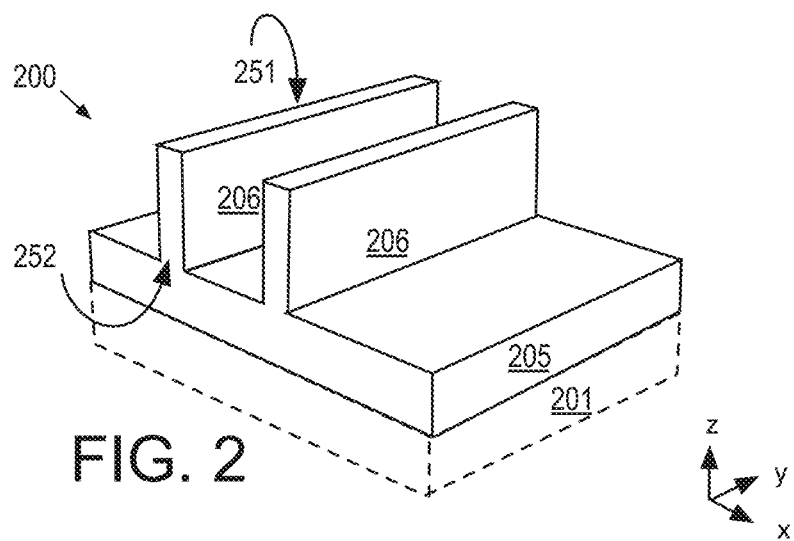
FIG. 2-6 illustrate isometric views of a transistor structure evolving as a channel region of fins are defined, in accordance with some embodiments.

FIG. 2-6 illustrate isometric views of a transistor structure evolving as a channel portion of fins are defined, in accordance with some embodiments. In FIG. 2, transistor structure 200 includes a plurality of non-planar bodies 206 that have been patterned into a front (top) side of substrate material layer 205. Bodies 206 include a front (top) surface 251 and a back (bottom) surface 252. Bodies 206 may have any non-planar (3D) shape, but in the embodiments illustrated, bodies 206 are fins that have a longitudinal length (e.g., y-axis) that is longer than their transverse width (e.g., x-axis). Any patterning etch process suitable for the fin material(s) may be employed to form bodies 206. Optionally, substrate material layer 205 is one substrate layer of a substrate that further includes one or more underlying substrate material layers 201. In some embodiments where substrate layer 201 is present, substrate layer 201 is an insulator such that substrate material layers 205 and 201 constitute a semiconductor-on-insulator (SOI) substrate structure. In other embodiments where substrate layer 201 is absent, substrate material layer 205 may be a top material layer of a bulk semiconductor substrate.

In some embodiments, substrate material layer 205 is a crystalline semiconductor. Although the crystalline semiconductor may be a polycrystalline thin film, in some exemplary embodiments the crystalline semiconductor is substantially monocrystalline. Non-planar bodies 206 may therefore also be substantially monocrystalline. In some embodiments, the crystallinity of substrate material layer 205 and non-planar bodies 206 is cubic with front surface 251 having crystallographic orientation of (100), (111), or (110), for example. However, other crystallographic orientations are also possible.

In some embodiments, substrate material layer 205 is a group IV semiconductor, such as, but not limited to substantially pure silicon (e.g., having only trace impurities), silicon alloys (e.g., SiGe), or substantially pure germanium (e.g., having only trace impurities). In other embodiments substrate material layer 205 is a Group III-V alloy with a first sub-lattice of at least one element from group III of the periodic table (e.g., Al, Ga, In, etc.), and a second sub-lattice of at least one element of group V of the periodic table (e.g., N, P, As, Sb, etc.). Non-planar bodies 206 may therefore also have any of these same compositions. Although bodies 206 may be of a substantially homogenous composition, bodies 206 may alternatively comprise one or more semiconductor heterojunctions that further include a first III-V compound semiconductor material on a second semiconductor material.

Substrate material layer 205 may have any conductivity type and have any impurity doping level. In some embodiments, at least a top (front) portion of non-planar bodies 206 is intrinsic semiconductor or substantially undoped with electrically active impurities. In some NMOS embodiments, at least a top portion of non-planar bodies 206 is intrinsic silicon, or has a slight p-type conductivity. In some PMOS embodiments, at least a top portion of non-planar bodies 206 is intrinsic silicon, or has a slight n-type conductivity. Although bodies 206 may be of a substantially homogenous impurity doping, bodies 206 may alternatively comprise one or more semiconductor homojunctions that further include a first impurity doping concentration of first conductivity type (e.g., p-type or n-type) interfacing a second impurity doping concentration of a second, complementary conductivity type (e.g., n-type or p-type).

Figure 3:
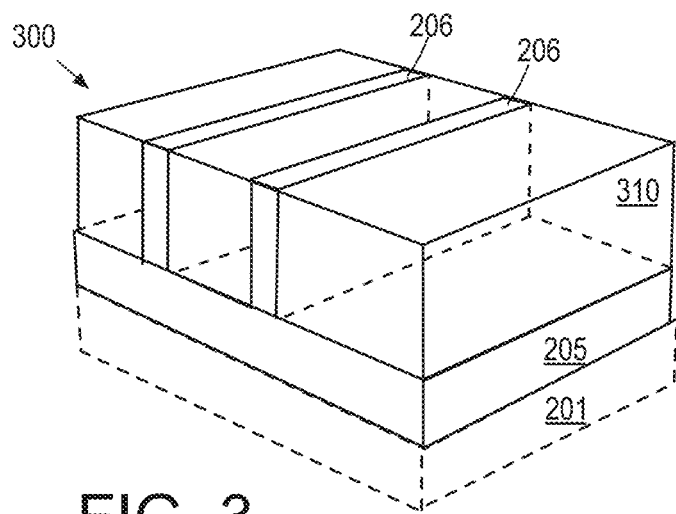
Figure 4:
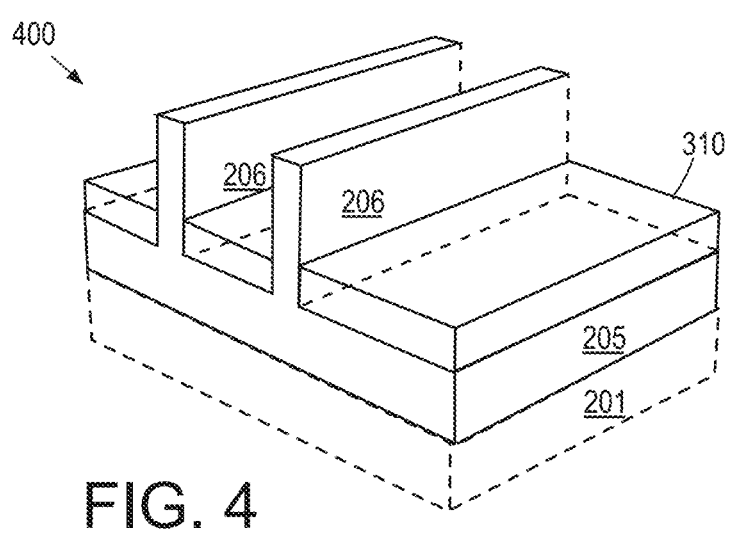

FIG. 3 illustrates a transistor structure 300 that includes dielectric material 310 applied to a front side of transistor structure 200. Dielectric material 310 may be any dielectric material suitable for electrical isolation of transistors such as, but not limited to, SiO, SiON, SiOC, hydrogen silsesquioxane, methyl silsesquioxane, polyimide, polynorbornenes, benzocyclobutene, or the like. Dielectric material 310 may be deposited as a flowable oxide, for example, and be substantially planar with front surface 251. FIG. 4. illustrates a transistor structure 400 that includes transistor structure 300 following a recess etch of a dielectric material 310. The recess etch exposes at least some sidewall of each non-planar body 206.

Figure 5:
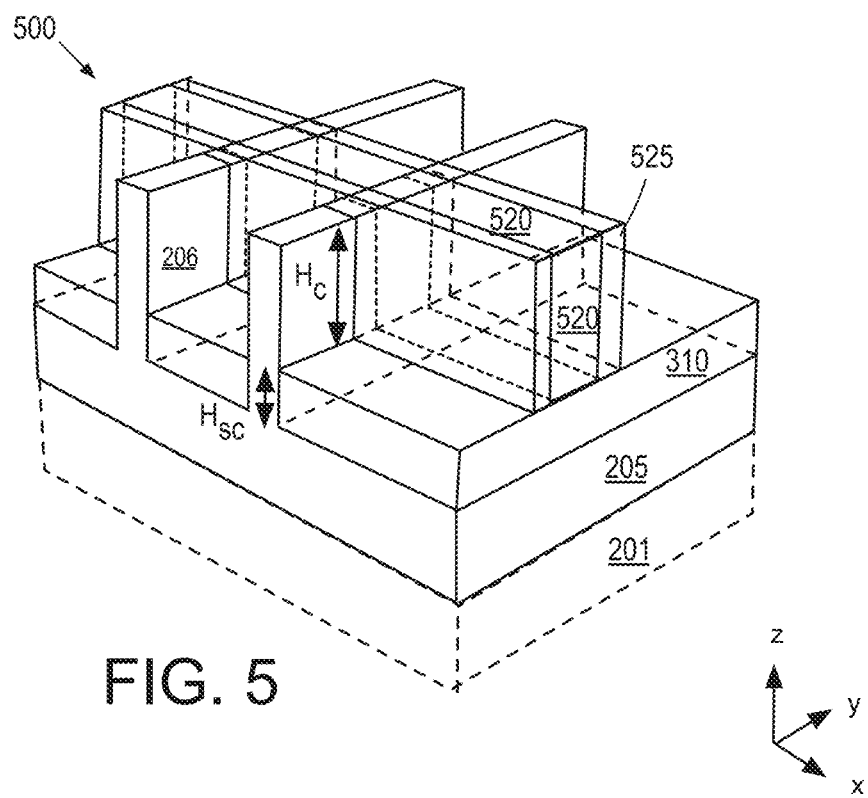

FIG. 5 illustrates a transistor structure 500 that includes a gate structure applied to a front side of transistor structure 400. The gate structure protects and/or defines a channel region of bodies 206. In some embodiments, the gate structure includes a gate sidewall spacer 525, which is to be adjacent to a sidewall of a gate electrode. Gate sidewall spacer 525 may be any dielectric material(s) known to be suitable as an insulator of a gate electrode, such as, but not limited to SiO, SiON, SiOC. The gate structure further includes a gate stack (or placeholder thereof) 520. Gate stack 520 includes a gate electrode (not depicted) separated from a channel region of non-planar bodies 206 by a gate dielectric (not depicted). Gate stack 520 may be any material(s) suitable as either a sacrificial or permanent gate stack, depending on whether a gate-last or gate-first fabrication process, respectively, is practiced.

As further illustrated in FIG. 5, the portion of bodies 206 not covered by dielectric material 310 that is covered by the gate structure defines a channel region of bodies 206. In FIG. 5, the channel portion has a channel sidewall height of $H_C$. Within the channel sidewall height of $H_C$, a gate electrode is adjacent to a sidewall of a body 206. The gate structure is over dielectric material 310 with dielectric material 310 being adjacent to a sidewall of a sub-channel portion of the bodies 206. In FIG. 5, the sub-channel portion has a sub-channel sidewall height of $H_{sc}$. Although dimensions can be expected to vary with technology node, in some exemplary embodiments where bodies 206 have a transverse width of 2-15 nm, channel sidewall height $H_C$ is in the range of 30-50 nm. The sub-channel portion may have any sidewall height $H_{sc}$, such as 10-30 nm, or even 50 nm, or more.

Figure 6:
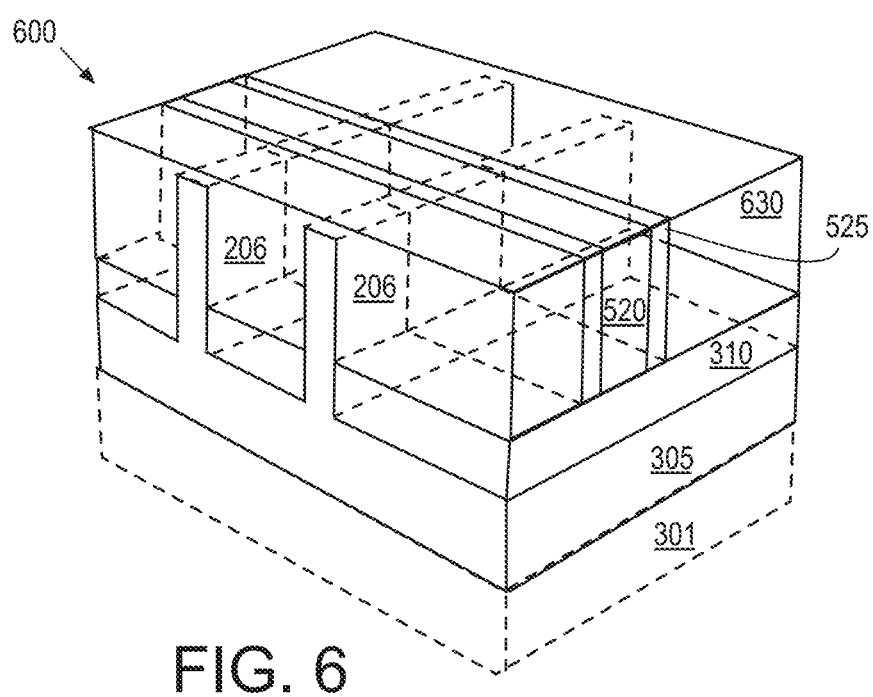

FIG. 6 illustrates a transistor structure 600 that includes a dielectric material 630 applied over a front side of transistor structure 500. Dielectric material 630 may be any dielectric material suitable for electrical isolation of transistors such as, but not limited to, SiO, SiON, SiOC, hydrogen silsesquioxane, methyl silsesquioxane, polyimide, polynorbornenes, benzocyclobutene, or the like. Dielectric material 630 may be deposited as a flowable oxide, for example, and be substantially planar with a front surface of gate stack 520.

Figure 7A:
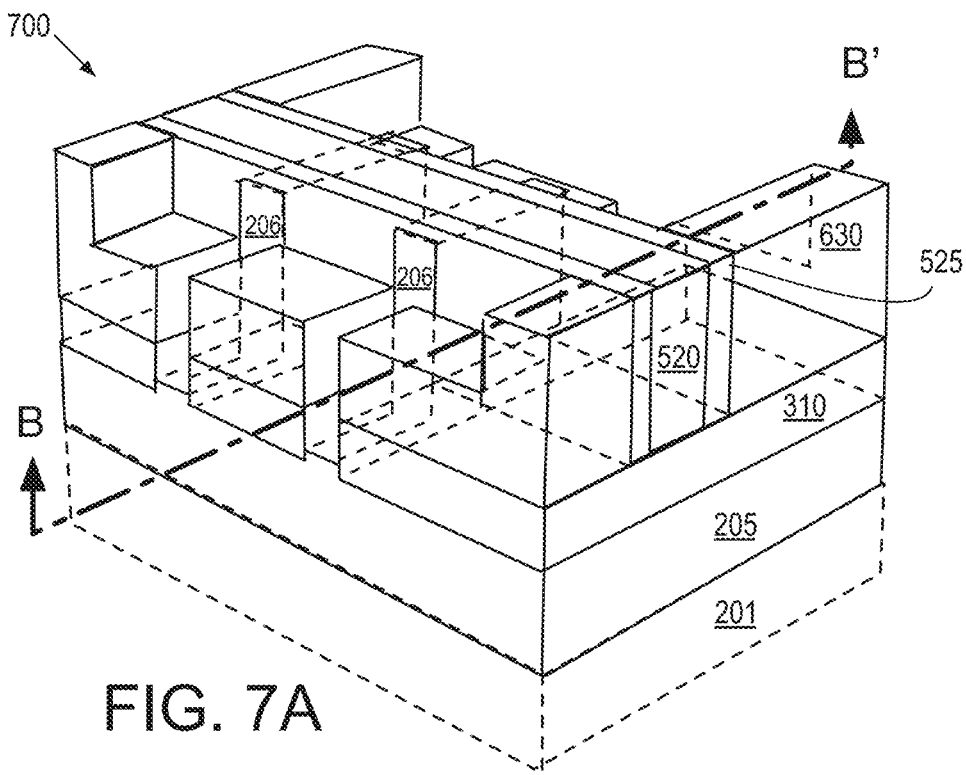
FIG. 7A illustrates an isometric view of a transistor structure following a deep source and/or drain fin etch, in accordance with some embodiments.
Figure 7B:
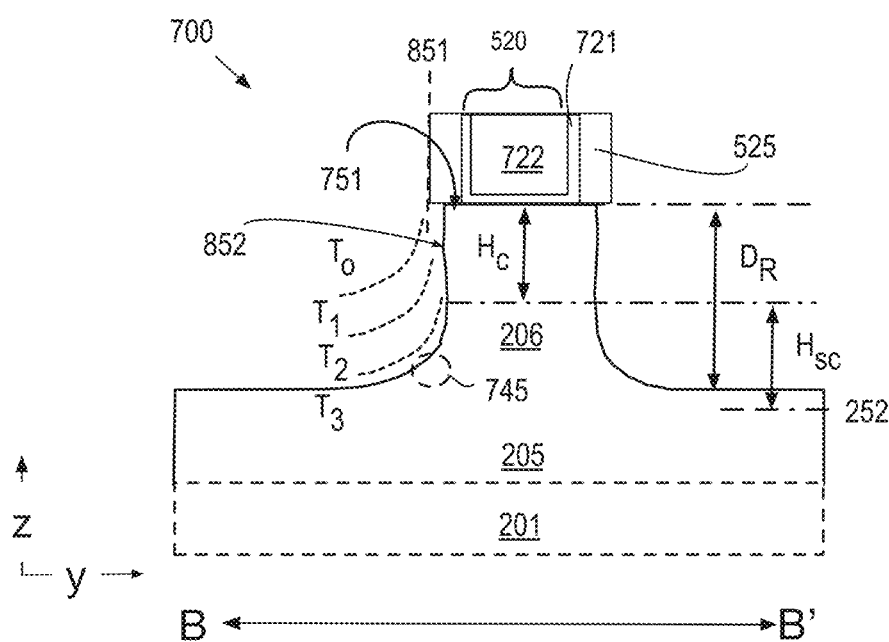
FIG. 7B illustrates a cross-sectional view of the transistor structure shown in FIG. 7A, in accordance with some embodiments.

FIG. 7A illustrates an isometric view of a transistor structure 700 that may be derived from transistor structure 600 by performing a front-side deep source and/or drain etch, in accordance with some embodiments. FIG. 7B illustrates a cross-sectional view of transistor structure 700 along the B-B' plane shown in FIG. 7A, in accordance with some embodiments.

As shown in FIGS. 7A and 7B, a portion of body 206 not protected by the gate stack and gate sidewall spacer 525 has been removed, for example with any etch process suitable for the composition of body 206. FIG. 7B further illustrates with dashed line how with longer etch times T0, T1, T2 ends of bodies 206 are recessed more deeply from front surface 751. At T0, for example, a bottom of the recess etch is at a depth from front surface 751 that is approximately equal to the channel sidewall height $H_c$. In accordance with some embodiments, the front-side deep source and/or drain etch recesses the bodies 206 by at least $H_c$, and advantageously significantly beyond (below) $H_C$. As shown, at etch time T3, the recess depth $D_R$ is well beyond channel sidewall height $H_C$ and has stopped somewhere within the sub-channel region. In some exemplary embodiments, the recess depth $D_R$ is 10-25 nm below the channel sidewall height $H_c$. Hence for some embodiments where the channel sidewall height He is 40-50 nm, the recess depth $D_R$ may be below the channel region by 25-50% channel sidewall height $H_c$. Although in the illustrated embodiment the deep source and/or drain etch has not reached the back surface 252, a sub-channel region may also be entirely removed during the recess etch with the recess depth $D_R$ then extending into substrate material layer 205, below bodies 206, and below dielectric 310.

In some embodiments, the deep source and/or drain etch undercuts a portion of a gate electrode sidewall spacer. In the illustrated example, spacer 525 is undercut with a channel sidewall 852 recessed from the outer sidewall of spacer 525 (demarked by dashed line 851). The amount of spacer undercut may vary, but channel sidewall 852 may be, aligned approximately with an outer edge of a gate dielectric 721, for example, or even located below a portion of a gate electrode 722. While any gate stack materials known to be suitable for bodies 206 may be utilized, in some exemplary embodiments gate dielectric 721 is a high-k material (with a bulk relative permittivity greater than 9), and gate electrode 722 includes a metal having a work function suitable for semiconductor bodies 206. Exemplary high-k materials include metal oxides, such as, but not limited to a metal oxide comprising predominantly aluminum (e.g., $Al_2O_3$), a metal oxide comprising predominantly magnesium (e.g., MgO), a metal oxide comprising predominantly lanthanum (e.g., $La_2O_3$), a metal oxide comprising predominantly hafnium (e.g., $HfO_2$), or an alloy metal oxide comprising significant portions of two or more of these metals (e.g., $HfAlO_x$). In some further embodiments, the high-k material further includes silicon. For example, metal silicates, such as, but not limited to $HfSiO_x$, or $TaSiO_x$ may also be suitable for some semiconductor body compositions (e.g., Si, Ge, SiGe, III-V). Gate electrode 722 may advantageously have a work function below 5 eV and may include a semiconductor (e.g., polycrystalline silicon), an elemental metal layer, a metal alloy layer, or laminate structure of any of these materials. In some embodiments, the gate electrode is a metal nitride, such as TiN (e.g., 4.0-4.7 eV). Gate electrode 722 may also comprise Al (e.g., TiAlN). Other alloy constituents may also be employed in a gate electrode, such as, but not limited to, C, Ta, W, Pt, and Sn. Although not depicted, gate stack 520 may further include one or more dielectric material(s) over a front (top) surface a gate electrode.

As further shown in FIG. 7B, a recess slope transition, or recess "corner" profile 745 is present between a nearly vertical (e.g., 70-90°) channel sidewall 852 and a bottom of the recess at depth $D_R$. The transition profile 745 may, for example extend significantly beyond outer spacer sidewall 851. As further shown in FIG. 7A, in addition to a recess etch of unprotected portions of bodies 206, a portion of dielectric material 630 may also be etched, for example to fully expose portions of bodies 206. Such a patterned etch may be according to an overlying mask (not depicted) with the further recess of bodies 206 performed in a self-aligned manner with an etchant that is selective to the composition of bodies 206.

Figure 8A:
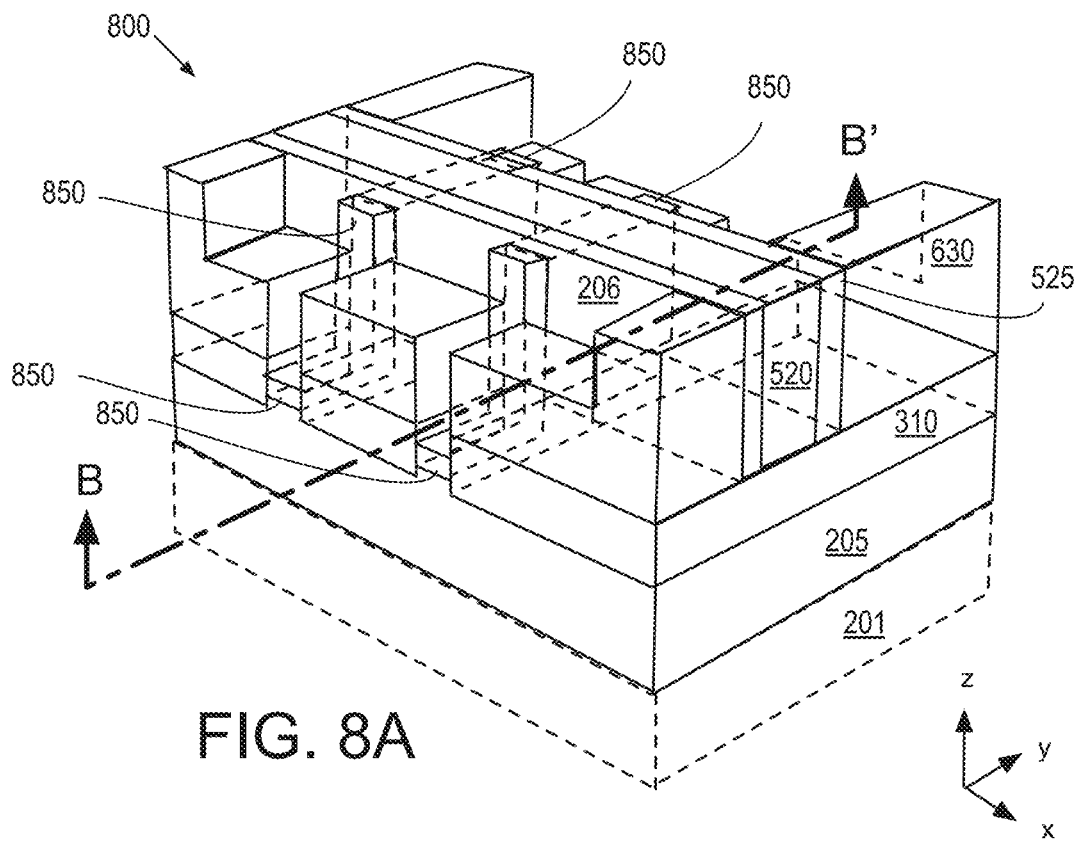
FIG. 8A illustrates an isometric view of a transistor structure following formation of a first source and/or drain material layer, in accordance with some embodiments.
Figure 8B:
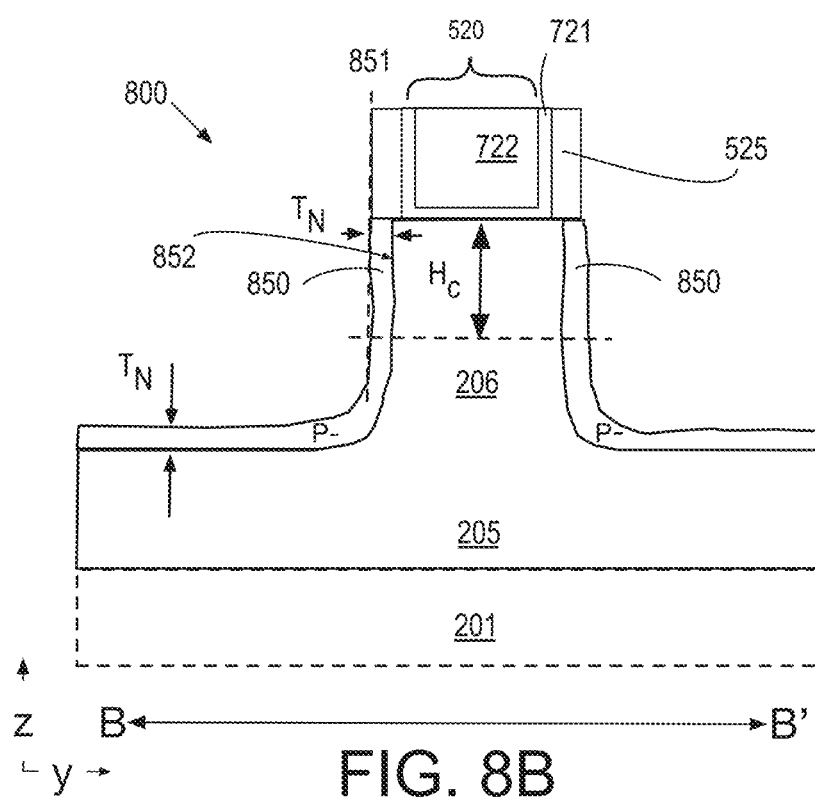
FIG. 8B illustrates a cross-sectional view of the transistor structure shown in FIG. 8A, in accordance with some embodiments.

FIG. 8A illustrates an isometric view of a transistor structure 800 following formation of a source and/or drain semiconductor material 850 over the transistor structure 700, in accordance with some embodiments. FIG. 8B illustrates a cross-sectional view of the transistor structure 800 along the B-B' plane shown in FIG. 8A, in accordance with some embodiments.

Although source and/or drain semiconductor material 850 may have any semiconductor composition, in some embodiments where bodies 206 are substantially pure silicon, source and/or drain semiconductor material 850 is also substantially pure silicon, having sufficient impurity doping concentration to achieve desired conductivity type (e.g., N-type for NMOS and p-type for PMOS) and density of states. In the exemplary PMOS embodiment illustrated, bodies 206 may be substantially pure silicon wherein source and/or drain semiconductor material 850 is a SiGe alloy (that may comprise predominantly silicon, or predominantly germanium).

Regardless of majority lattice composition and conductivity type, source and/or drain semiconductor material 850 is advantageously lightly doped to have an electrically active impurity concentration that is higher than that of the channel region of bodies 206. In some specific embodiments, the impurity concentration is in the range of $5e^{19}$-$2e^{20}$ atoms/$cm^3$. Source and/or drain semiconductor material 850 may have an electrically active impurity concentration that ensures a conductivity type complementary to that of the channel portion. In some exemplary NMOS embodiments, source and/or drain semiconductor material 850 comprises an N-type dopant, such as, but not limited to phosphorus. In the exemplary PMOS embodiment illustrated, source and/or drain semiconductor material 850 comprises a P-type dopant, such as, but not limited to, boron.

Lightly-doped source and/or drain semiconductor material may be either non-epitaxial or epitaxial. In the example shown in FIG. 8A, source and/or drain semiconductor material 850 is formed selectively on exposed portions of bodies 206 and/or substrate material layer 205. In some such embodiments, source and/or drain semiconductor material is selectively formed with a semiconductor epitaxial growth process which seeds from exposed surfaces over bodies 206 and/or substrate material layer 205. With epitaxial growth, source and/or drain semiconductor material 850 has crystallinity associated with that of body 206 and/or substrate material layer 205. For example, where body 206 and/or substrate material layer 205 have cubic crystallinity of a given orientation, source and/or drain semiconductor material 850 may also have cubic crystallinity with that same orientation, particularly for advantageous embodiments where source and/or drain semiconductor material 850 is monocrystalline. Even for alternative embodiments where source and/or drain semiconductor material 850 is only polycrystalline, epitaxially grown source and/or drain semiconductor material 850 has texture favoring the crystallinity of body 206.

As further shown in FIG. 8B, source and/or drain semiconductor material 850 has a thickness of $T_N$ in a direction substantially normal to channel sidewall 852. In the illustrated example, source and/or drain semiconductor material 850 has substantially the same thickness $T_N$ at a bottom of the recess (i.e., semiconductor material 850 is substantially conformal). Although thickness $T_N$ may vary with implementation, in some embodiments it is less than, or approximately equal to, the amount of undercut below the gate stack, such that source and/or drain semiconductor material 850 does not extend laterally (e.g., y-dimension) beyond outer spacer sidewall 851 over at least the entire channel sidewall height $H_c$.

Figure 9A:
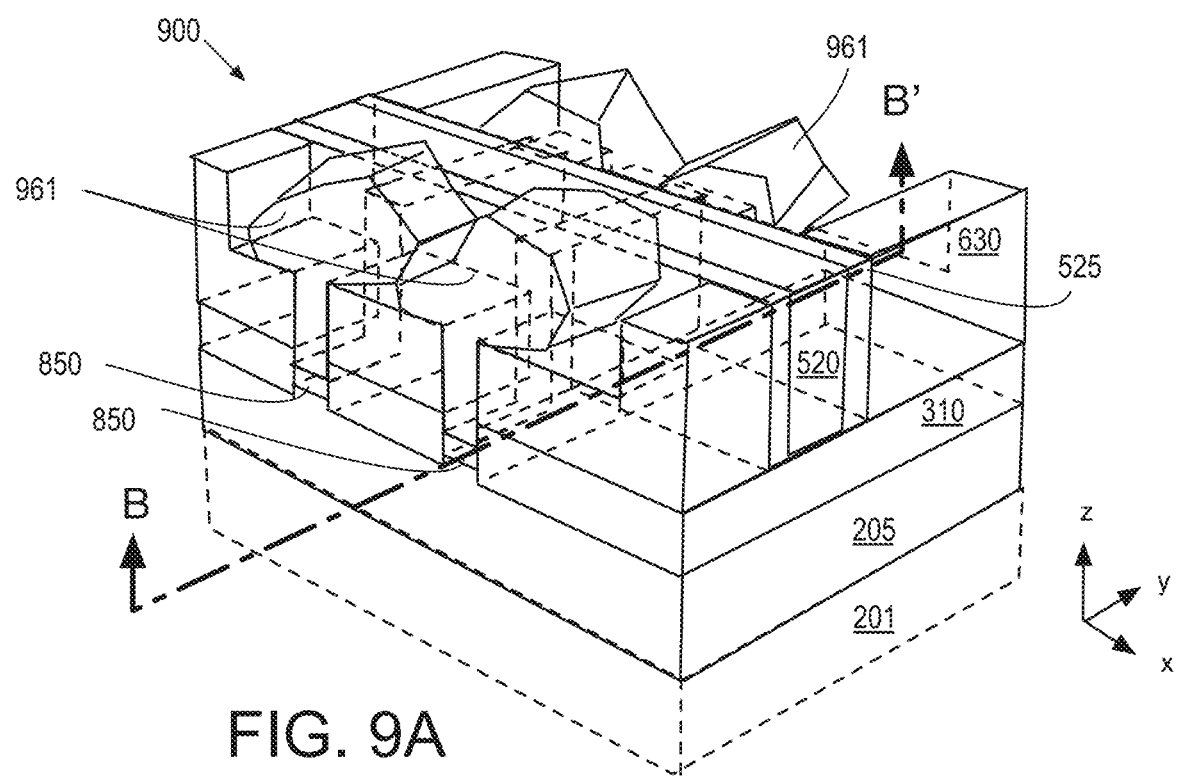
FIG. 9A illustrates an isometric view of a transistor structure following formation of second source and/or drain material layer, in accordance with some embodiments.
Figure 9B:
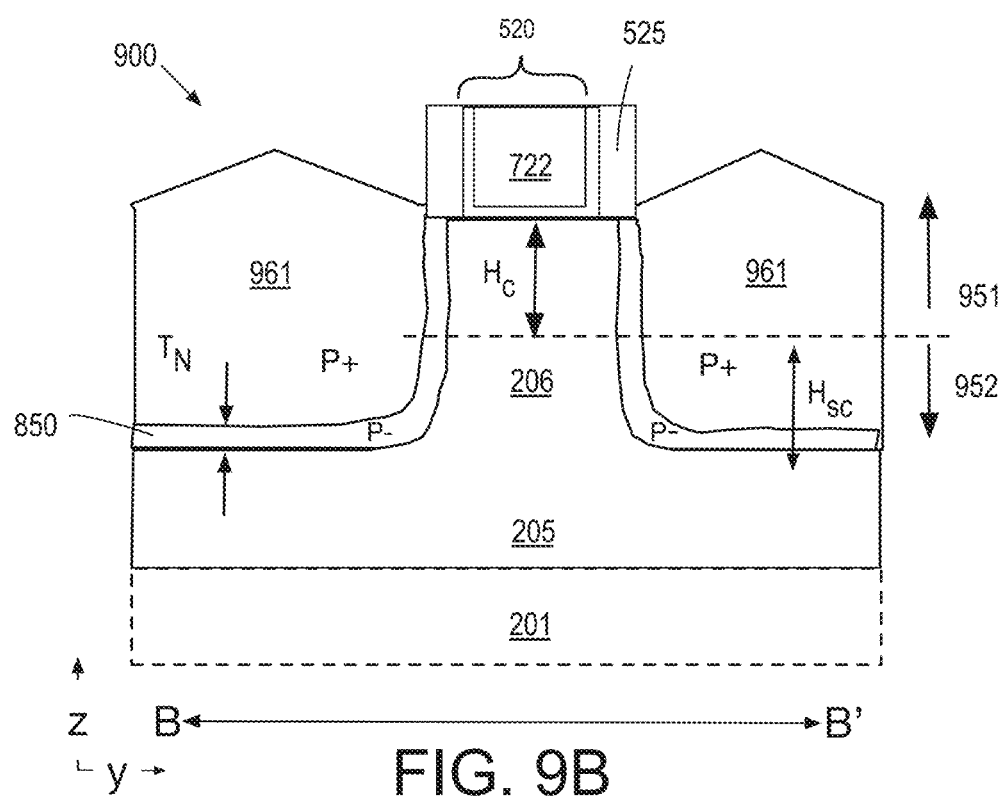
FIG. 9B illustrates a cross-sectional view of the transistor structure shown in FIG. 9A, in accordance with some embodiments.

FIG. 9A illustrates an isometric view of a transistor structure 900 following formation of deep source/drain semiconductor in transistor structure 800, in accordance with some embodiments. FIG. 9B illustrates a cross-sectional view of the transistor structure 900 along the B-B' plane shown in FIG. 9A, in accordance with some embodiments.

Source and/or drain semiconductor material 961 at least partially backfills the deep source and/or drain recesses. Source and/or drain semiconductor material 961 is in contact with source and/or drain semiconductor material 850. Source and/or drain semiconductor material 961 may have any semiconductor composition, such as, but not limited to predominantly silicon, predominantly germanium, or a III-V binary, ternary or quaternary alloy. In some exemplary embodiments source and/or drain semiconductor material 961 has the different majority lattice constituents than source and/or drain semiconductor material 850. For example, where source and/or drain semiconductor material 850 is predominantly silicon, source and/or drain semiconductor material 961 comprises less silicon than source and/or drain semiconductor material 850. Or, where source and/or drain semiconductor material 850 is a SiGe alloy, source and/or drain semiconductor material 961 is not a SiGe alloy, or is a SiGe alloy with a different Si:Ge ratio. In some other embodiments source and/or drain semiconductor material 961 has the same majority lattice constituents as source and/or drain semiconductor material 850. For example, where source and/or drain semiconductor material 850 is predominantly silicon, source and/or drain semiconductor material 961 is also predominantly silicon. Or, where source and/or drain semiconductor material 850 is a SiGe alloy, source and/or drain semiconductor material 961 is also a SiGe alloy, and that alloy may have substantially the same Si:Ge ratio, or not.

Regardless of majority lattice composition and conductivity type, source and/or drain semiconductor material 961 is advantageously heavily doped to have an electrically active impurity concentration that is at least higher than that of source and/or drain semiconductor material 850. In some specific embodiments, the impurity concentration is in the range of $2e^{20}$-$1e^{21}$ atoms/cm$^3$. Source and/or drain semiconductor material 961 may have an electrically active impurity concentration ensures it has a conductivity type complementary to that of the channel portion (therefore having the same conductivity type as source and/or drain semiconductor material 850) and a high density of states. In some exemplary NMOS embodiments, source and/or drain semiconductor material 961 comprises an N-type dopant, such as, but not limited to phosphorus. In the exemplary PMOS embodiment illustrated, source and/or drain semiconductor material 961 comprises a P-type dopant, such as, but not limited to, boron.

Heavily-doped source and/or drain semiconductor material may be either non-epitaxial or epitaxial. In the example shown in FIG. 9A, source and/or drain semiconductor material 961 is formed selectively on source and/or drain semiconductor material 850. In some such embodiments, source and/or drain semiconductor material is selectively formed with a semiconductor epitaxial growth process which seeds from source and/or drain semiconductor material 850 that serves as a nucleation layer during the epitaxial growth. With epitaxial growth, source and/or drain semiconductor material 961 has crystallinity associated with that of semiconductor material 850, and therefore also that of body 206. For example, where semiconductor material 850 has cubic crystallinity of a given orientation, source and/or drain semiconductor material 961 may also have cubic crystallinity with that same orientation, particularly for embodiments where source and/or drain semiconductor material 961 is predominantly a single crystal, or comprises only a few large crystal grains. Even for alternative embodiments where source and/or drain semiconductor material 961 has many crystal grains, epitaxially grown source and/or drain semiconductor material 961 has texture favoring the crystallinity of semiconductor material 850, and therefore also that of body 206.

As shown in FIG. 9A, source and/or drain semiconductor material 961 may expand laterally where the growth is not confined by dielectric materials 310 and/or 630. Depending on the pitch of adjacent non-planar bodies 206, which might be 30 nm, or less, for example, source and/or drain semiconductor material 961 grown from separate nucleation areas may merge together. For such a structure, multiple non-planar bodies 206 may be operable in electrical parallel, or at least share one common electrical terminal.

As shown in FIG. 9B, source and/or drain semiconductor material 961 includes a front-side portion 951 that is adjacent to a sidewall of the channel region (within channel sidewall height $H_C$) with only source and/or drain semiconductor material 850 between channel sidewall 852 and source and/or drain semiconductor material 961. As such, within the channel region source and/or drain semiconductor material 850 is operable as a lightly doped source or drain (LDD) region. Source and/or drain semiconductor material 961 includes a back-side portion 952 that is adjacent to a sidewall of the sub-channel region (within sub-channel sidewall height $H_{sc}$). The thickness $T_N$ of source and/or drain semiconductor material 850 is between source and/or drain semiconductor material 961 and underlying substrate material 205.

Figure 10A:
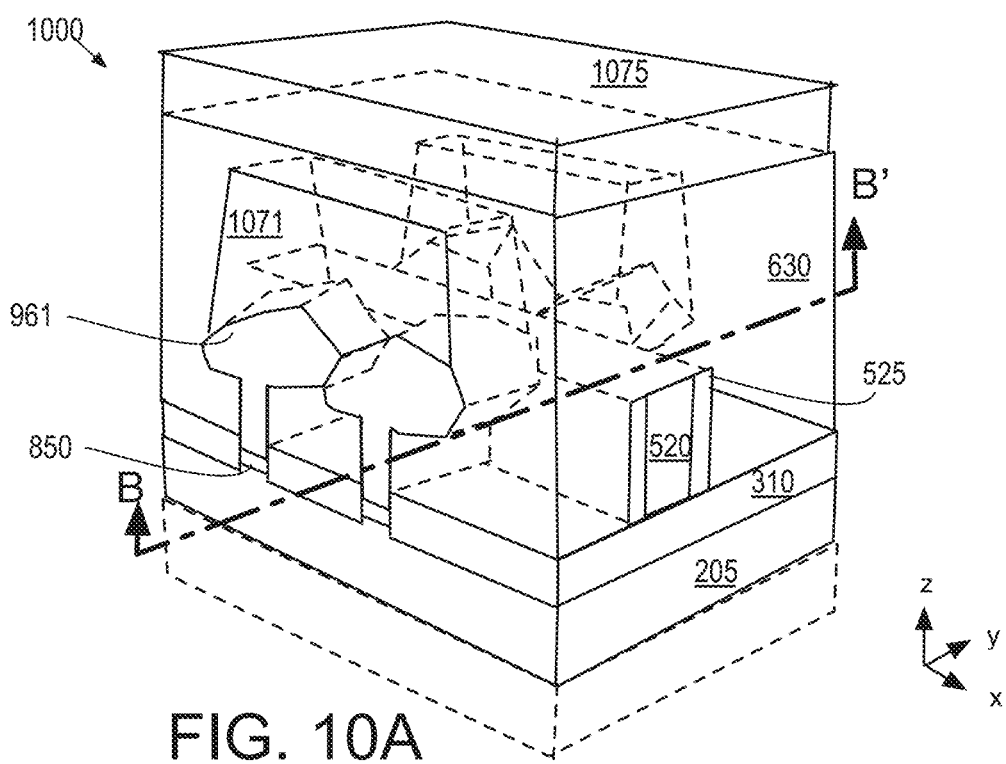
FIG. 10A illustrates an isometric view of a transistor structure following front-side interconnection, in accordance with some embodiments.
Figure 10B:
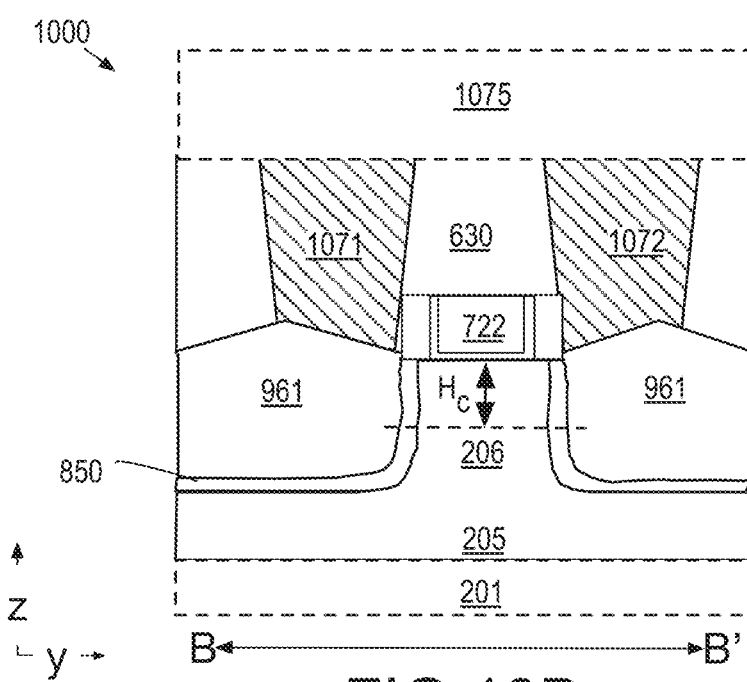
FIG. 10B illustrates a cross-sectional view of the transistor structure shown in FIG. 10A, in accordance with some embodiments.

FIG. 10A illustrates an isometric view of a transistor structure 1000 following front-side interconnection of the transistor structure 900, in accordance with some embodiments. FIG. 10B illustrates a cross-sectional view of the transistor structure 1000 along the B-B' plane shown in FIG. 10A, in accordance with some embodiments. In the illustrated embodiments both a front-side source contact metallization 1071 and a front-side drain contact metallization 1072 makes contact with source and/or drain semiconductor material 961. Each of source and drain contact metallizations 1071 and 1072 may comprise one or more metal or metal alloy known to be suitable for forming a low resistance contact to source and/or drain semiconductor material 961. For example, source and drain contact metallizations 1071 and 1072 may have a same composition that includes at least one of Co, Ti, Vn, Ni, Pt. Each of source and drain contact metallizations 1071 and 1072 may further comprise silicon (e.g., a metal silicide). As shown, with source and/or drain semiconductor material 850 only along the sidewall of the channel region (e.g., below gate sidewall spacer 525), source and drain contact metallizations 1071 and 1072 are in contact with source and/or drain semiconductor 961 that has high impurity doping and a low resistance ohmic metal-semiconductor junction is achieved.

Although both source and drain contact metallizations 1071 and 1072 are illustrated, one or both may be absent from a transistor structure, for example in exclusive reliance of back-side contact metallization described further below. As further shown in FIG. 10A-10B, any number of front-side interconnect levels 1075 may further interconnect transistor structure 1000 to various IC nodes. For example, interconnect levels 1075 may couple source contact metallization 1071 to a source node of an IC while interconnect levels 1075 may couple drain contact metallization 1072 to a drain node of the IC. Notably, even where one or both of source and drain contact metallizations 1071 and 1072 are present as part of a transistor structure, one or both of source and drain contact metallizations 1071 and 1072 may not be further interconnected to a IC node through top-side interconnect levels. For such embodiments, a source and/or drain may be interconnected to a IC node through only back-side contact metallization, for example as described further below for a transistor source terminal.

Figure 11A:
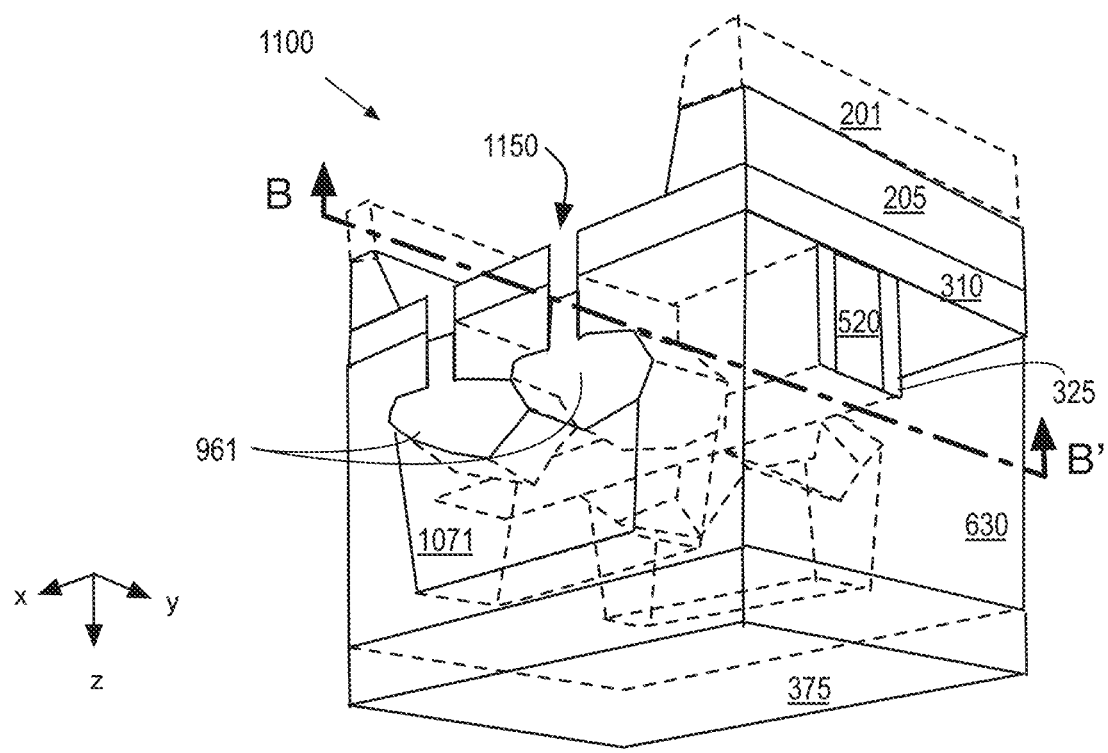
FIG. 11A illustrates an isometric view of a transistor structure following a back-side source and/or drain contact etch, in accordance with some embodiments.
Figure 11B:
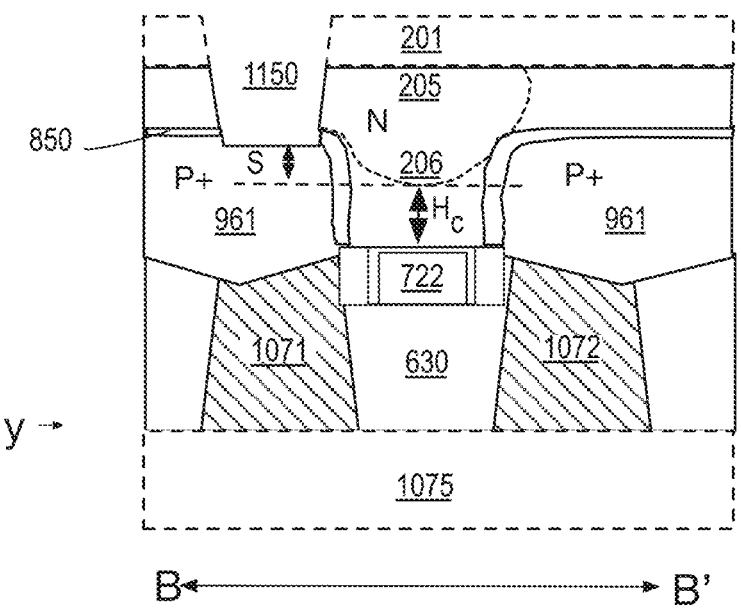
FIG. 11B illustrates a cross-sectional view of the transistor structure shown in FIG. 11A, in accordance with some embodiments.

FIG. 11A illustrates an isometric view of a transistor structure 1100 following a back-side source and/or drain contact etch, in accordance with some embodiments. FIG. 11B illustrates a cross-sectional view of the transistor structure 1100 along the B-B' plane shown in FIG. 11A, in accordance with some embodiments. As shown FIGS. 11A and 11B are inverted relative to FIG. 10A-10B, for example following front side wafer processing where dielectric on the front side may be polished, and bonded to a carrier wafer. The backside of a wafer may be ground, lapped, and/or polish to near a back side of transistor structure 1100.

In FIGS. 11A and 11B, a back surface of source and/or drain semiconductor material is exposed from a back side of transistor structure 1100. In the example shown, a back-side opening 1150 is etched into substrate material layer 205 (and also through any back-side substrate material layer 201). In one example where source and/or drain semiconductor 961 is operable as a source terminal of transistor structure 1100 and source and/or drain semiconductor material 962 is operable as a drain terminal of transistor structure 1100, there only one back-side opening 1150 exposes the source semiconductor material with the drain terminal masked during the backside source/drain contact etch.

Back-side opening 1150 extends through or passes through the thickness of source/drain semiconductor material 850 that is lining the deep source/drain semiconductor structure, and opening 1150 intersects a back side portion of source and/or drain semiconductor material 961. As further shown in FIG. 11B, with source and/or drain semiconductor material 961 having a sufficient depth below channel sidewall height $H_c$, and source/drain semiconductor material 850 adjacent to a sidewall of the channel region that is nearly vertical well into the sub-channel region, back-opening 1150 passes through only the nominal thickness of source and/or drain semiconductor material 850. Also, source and/or drain semiconductor material 961 having a sufficient depth below channel sidewall height $H_c$, significant vertical (z-axis) separation S can be maintained between the channel region and back-side opening 1150 so that the source and/or drain semiconductor material 850 can be cleared with a significant amount of semiconductor over etch without risk of exposing the channel region to a semiconductor etch even if opening 1150 was laterally misaligned.

As further shown in FIG. 11B, optionally at least a portion of the sub-channel region adjacent to opening 1150 may be impurity doped to a concentration level exceeding that of the channel region. In some such embodiments, for example, a portion of the sub-channel region adjacent to opening 1150 may be doped (e.g., through ion implantation) to have conductivity complementary to that of the source drain semiconductor materials 850 and 961. For example, in transistor structure 1100 where source drain semiconductor materials 850 and 961 are P-type, the portion of the sub-channel region adjacent to opening 1150 (e.g., demarked by dashed line) has N-type conductivity. The deep source and/or drain structures may thereby be electrically isolated from one another. Alternatively, at least some portion of the sub-channel region adjacent to opening 1150 (e.g., demarked by dashed line) may be converted to, or replaced with, a dielectric material that may serve to electrically isolate the deep source and/or drain structures from each other.

Figure 12A:
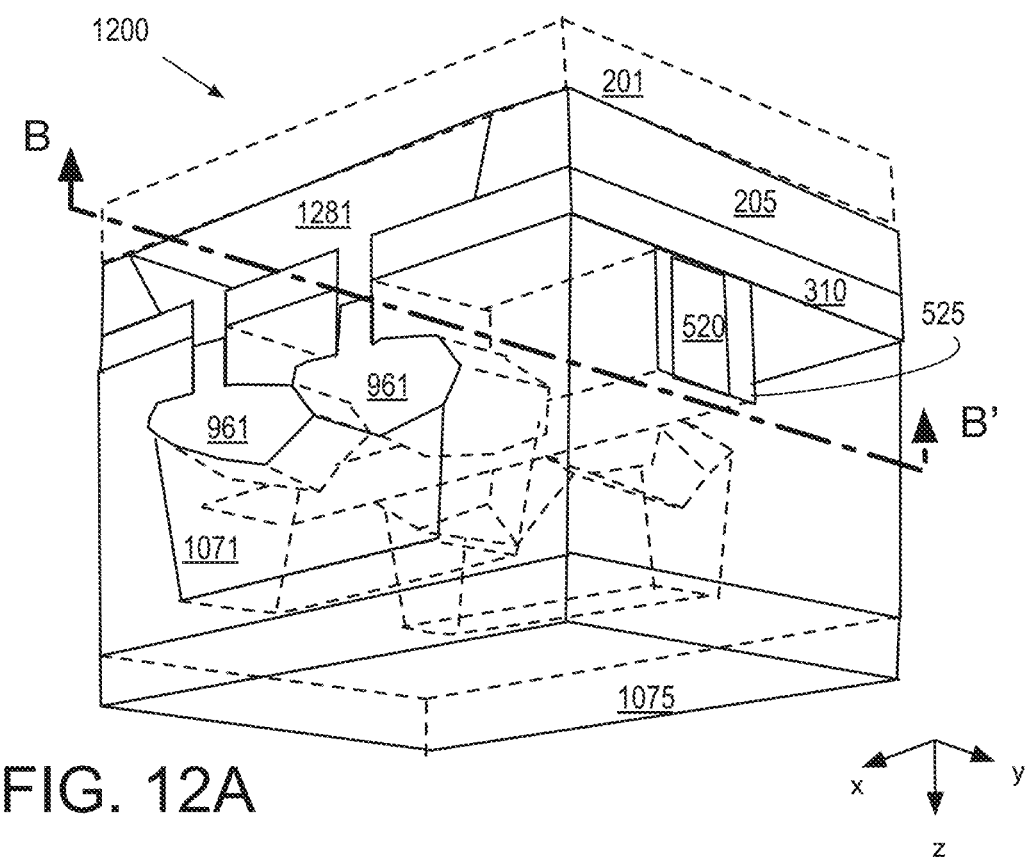
FIG. 12A illustrates an isometric view of a transistor structure following back-side interconnection, in accordance with some embodiments.
Figure 12B:
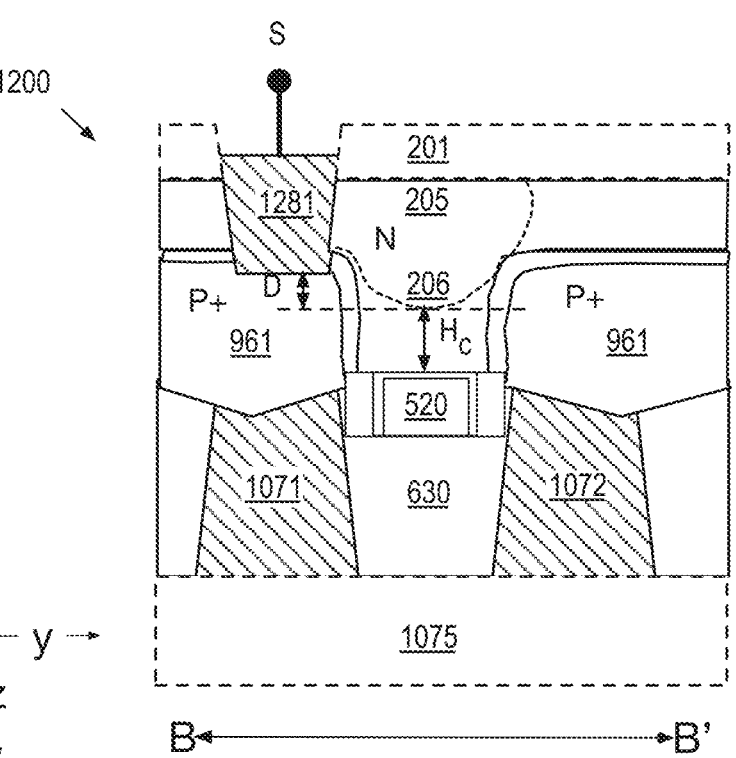
FIG. 12B illustrates a cross-sectional view of the transistor structure shown in FIG. 12A, in accordance with some embodiments.

FIG. 12A illustrates an isometric view of a transistor structure 1200 following back-side interconnection, in accordance with some embodiments. FIG. 12B illustrates a cross-sectional view of the transistor structure 1200 along the B-B' plane shown in FIG. 12A, in accordance with some embodiments. As shown, back-side source contact metallization 1281 at least partially backfills opening 1150. In the illustrated embodiment, only a back-side source contact metallization 1281 makes contact with source and/or drain semiconductor material 961. However, a back-side drain contact metallization (not depicted) may also be present in alternative embodiments. Back-side source contact metallization 1281 may again comprise one or more metal or metal alloy known to be suitable for forming a low resistance contact to source and/or drain semiconductor material 961. Back-side source contact metallization 1281 may have the same composition as contact metallizations 1071, 1072 (e.g., Co, Ti, Vn, Ni, Pt). Back-side source contact metallization 1281 may further comprise silicon (e.g., a metal silicide). As shown, back-side source contact metallization 1281 extends through lightly-doped semiconductor material 850 and is in contact with source and/or drain semiconductor 961 that has high impurity doping. Back-side source contact metallization 1281 can therefore also achieve a low resistance ohmic metal-semiconductor junction.

Back-side source contact metallization 1281 may make a second electrical interconnection to the source of transistor structure 1200, with metallization 1071 making a first electrical connection to the source of transistor structure 1200. Metallizations 1071 and 1281 may either be electrically coupled to different circuit nodes, or metallization 1071 may merely remain un-terminated as a structural artifact of the front-side contact metallization process.

Figure 13:
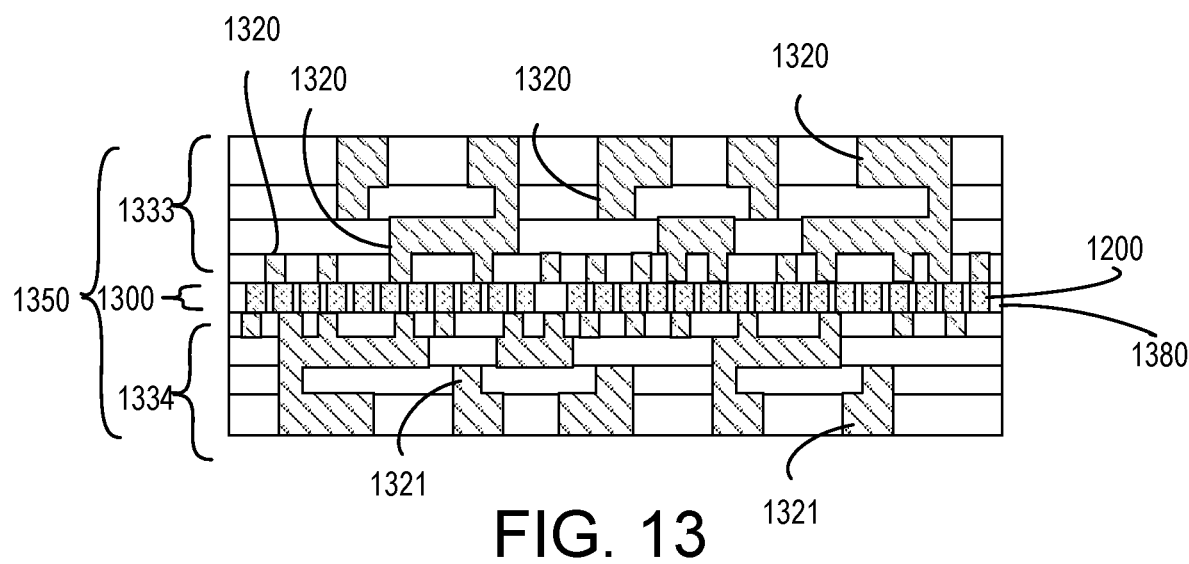
FIG. 13 illustrates a cross-sectional view of a transistor layer with front-side and back-side interconnect metallization, in accordance with some embodiments.

FIG. 13 illustrates a cross-sectional view of an integrated circuit 1350 including a device layer 1300 with front-side interconnect metallization 1333 over one side of device layer 1300, and back-side metallization 1334 over another side of device layer 1300, in accordance with some embodiments. Device layer 1300 may include a plurality of transistor structures 1200, for example. Front-side interconnect metallization 1333 includes a plurality of interconnect metallization levels 1320 embedded within inter-layer dielectric (ILD) 1380. Back-side interconnect metallization 1334 includes a plurality of interconnect metallization levels 1321 embedded within inter-layer dielectric (ILD). Front-side interconnect metallization 1333 and back-side interconnect metallization 1334 may have different material compositions and/or dimensions, for example. Each of interconnect metallizations 1333 and 1334 may have any number of levels with higher levels typically having dimensions relaxed from those of lower levels. Device layer 1200, as fully interconnected with both front-side interconnect metallization 1333 and back-side interconnect metallization 1334, may be one IC stratum within a 3D IC.

Figure 14:
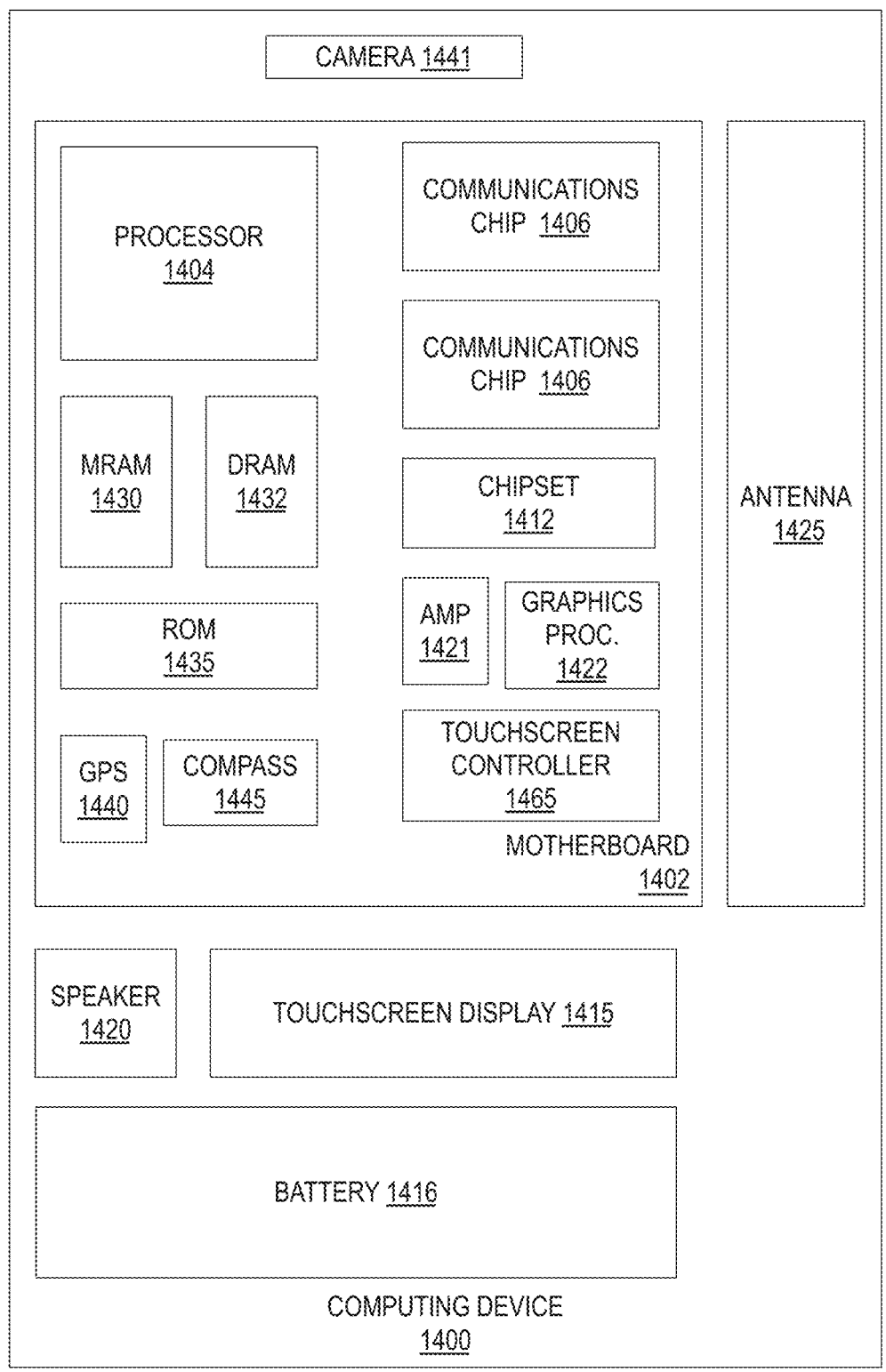
FIG. 14 is a functional block diagram of an electronic computing device, in accordance with some embodiments.

FIG. 14 is a functional block diagram of an electronic computing device 1400, in accordance with some embodiments. Device 1400 further includes a motherboard 1402 hosting a number of components, such as, but not limited to, a processor 1404 (e.g., an applications processor). Processor 1404 may be physically and/or electrically coupled to motherboard 1402. In some examples, processor 1404 includes a transistor structure with a back-side contact metallization to deep source and/or drain semiconductor, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1406 may also be physically and/or electrically coupled to the motherboard 1402. In further implementations, communication chips 1406 may be part of processor 1404. Depending on its applications, computing device 1400 may include other components that may or may not be physically and electrically coupled to motherboard 1402. These other components include, but are not limited to, volatile memory (e.g., DRAM 1432), non-volatile memory (e.g., ROM 1435), flash memory (e.g., NAND or NOR), magnetic memory (MRAM 1430), a graphics processor 1422, a digital signal processor, a crypto processor, a chipset 1412, an antenna 1425, touchscreen display 1415, touchscreen controller 1465, battery 1416, audio codec, video codec, power amplifier 1421, global positioning system (GPS) device 1440, compass 1445, accelerometer, gyroscope, speaker 1420, camera 1441, and mass storage device (such as hard disk drive, solid-state drive (SSD), compact disk (CD), digital versatile disk (DVD), and so forth), or the like. In some exemplary embodiments, at least one of the functional blocks noted above comprise an IC including a transistor structure with a back-side contact metallization to deep source and/or drain semiconductor for example as described elsewhere herein.

Communication chips 1406 may enable wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1406 may implement any of a number of wireless standards or protocols, including but not limited to those described elsewhere herein. As discussed, computing device 1400 may include a plurality of communication chips 1406. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

Figure 15:
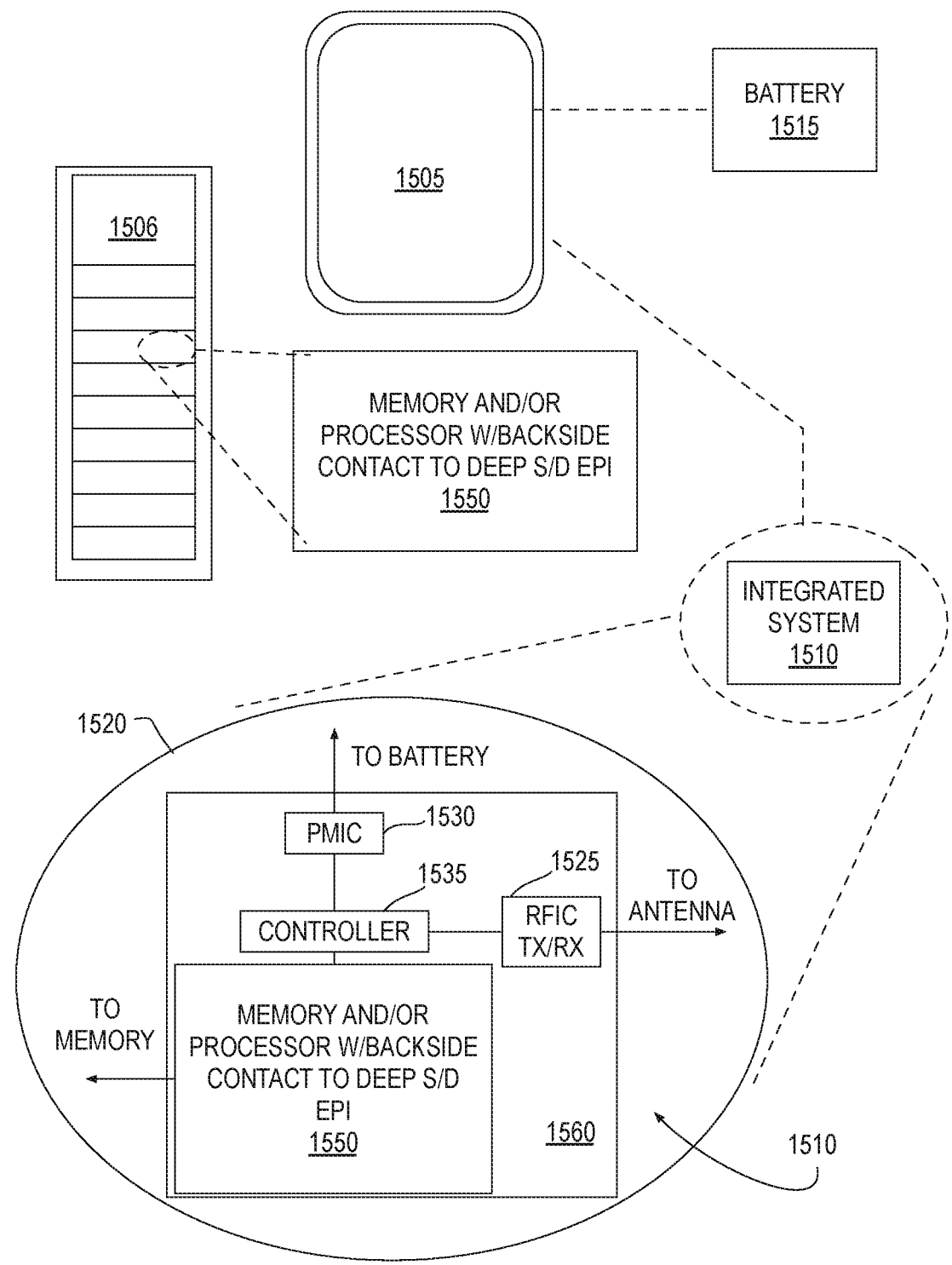
FIG. 15 is a diagram of an exemplary platform including back-side transistor interconnection through deep source/drain semiconductor structures, in accordance with some embodiments.

FIG. 15 is a diagram of an exemplary platform 1505 including an IC that has back-side transistor interconnection through deep source/drain semiconductor structures, in accordance with some embodiments. Computing device 1400 may be found inside platform 1505 or server machine 1506, for example. The server machine 1506 may be any commercial server, for example including any number of high-performance computing platforms disposed within a rack and networked together for electronic data processing, which in the exemplary embodiment includes a packaged SoC 1550 that further includes a transistor structure with back-side contact metallization to deep source and/or drain semiconductor, for example as described elsewhere herein. The mobile computing platform 1505 may be any portable device configured for each of electronic data display, electronic data processing, wireless electronic data transmission, or the like. For example, the mobile computing platform 1505 may be any of a tablet, a smart phone, laptop computer, etc., and may include a display screen (e.g., a capacitive, inductive, resistive, or optical touchscreen), a chip-level or package-level integrated system 1510, and a battery 1515.

Whether disposed within the integrated system 1510 illustrated in the expanded view 1520, or as a stand-alone chip within the server machine 1506, IC package 1550 may include a transistor structure with back-side contact metallization to deep source and/or drain semiconductor, for example as described elsewhere herein. IC package 1550 may be further coupled to a board, a substrate, or an interposer 1560 along with, one or more of a power management integrated circuit (PMIC) 1530, RF (wireless) integrated circuit (RFIC) 1525 including a wideband RF (wireless) transmitter and/or receiver (TX/RX) (e.g., including a digital baseband and an analog front end module that further comprises a power amplifier on a transmit path and a low noise amplifier on a receive path), and a controller 1535.

Functionally, PMIC 1530 may perform battery power regulation, DC-to-DC conversion, etc., and so has an input coupled to battery 1515 and with an output providing a current supply to other functional modules. As further illustrated, in the exemplary embodiment, RFIC 1525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, a transistor structure comprises a fin comprising a channel region over a sub-channel region, the channel region comprising a first semiconductor material having a first impurity concentration. A gate electrode is adjacent to a sidewall of the channel region, and over a dielectric material that is adjacent to a sidewall of the sub-channel region. A source region and a drain region are on opposite sides of the gate electrode. At least one of the source region and the drain region comprises a second semiconductor material that has a second impurity concentration greater than the first impurity concentration, and a third semiconductor material between the second semiconductor material and the sidewall of both the channel region and the sub-channel region. The third semiconductor material has a third impurity concentration exceeding the first impurity concentration, but less than the second impurity concentration. First contact metallization coupled to a first side of the source region or drain region, the first contact metallization in contact with the second semiconductor material. Second contact metallization coupled to a second side of the source region or drain region, opposite the first side, the second contact metallization also in contact with the second semiconductor material.

In second examples, for any of the first examples, the source region comprises the third semiconductor material between the sidewall of both the channel region and the sub-channel region. The second contact metallization extends through the third semiconductor material, and a sidewall of the third semiconductor material that is adjacent to the sub-channel region is substantially below a sidewall of a gate spacer that is between a sidewall of the gate electrode and the source region.

In third examples, for any of the first through second examples, the first semiconductor material is monocrystalline and comprises predominantly silicon. The second semiconductor material is in contact with the third semiconductor material. The second and third semiconductor materials have crystallinity that is epitaxial with that of the first semiconductor material.

In fourth examples, for any of the third examples, the second semiconductor material comprises more germanium than the first semiconductor material. The second and third semiconductor materials are both p-type, and the second and third impurity concentrations comprise p-type impurity dopants.

In fifth examples, for any of the third or fourth examples the first, second, and third semiconductor materials each comprise predominantly silicon, and the second and third semiconductor materials are both n-type, the second and third impurity concentrations comprising at least phosphorus.

In sixth examples, for any of third or fourth examples the sub-channel region is a portion of a substrate layer, and the second contact metallization extends through a thickness of the third semiconductor material that is between the second semiconductor material and the substrate layer.

In seventh examples, for any of the sixth examples the sub-channel region comprises predominantly silicon and has a conductivity type complementary to that of the channel region.

In eighth examples, for any of first through seventh examples a sidewall of the second contact metallization is in contact with the second semiconductor material.

In ninth examples, for any of the first through eighth examples only the third semiconductor material is between the second contact metallization and the sidewall of the sub-channel region.

In tenth examples, for any of the first through ninth examples, the third semiconductor material is between the second contact metallization and the sidewall of the channel region.

In eleventh examples, an integrated circuit (IC), comprises a plurality of first interconnect metallization levels, a plurality of second interconnect metallization levels, and an active device layer between the first and second metallization levels. The active device layer comprises a plurality of transistor structures. At least one of the transistor structures further comprises a fin comprising a channel region over a sub-channel region. The channel region comprises a first semiconductor material having a first impurity concentration. A gate electrode is adjacent to a sidewall of the channel region, and over a dielectric material that is adjacent to a sidewall of the sub-channel region. A source region and a drain region are on opposite sides of the gate electrode, wherein at least one of the source region and the drain region comprises a second semiconductor material that has a second impurity concentration greater than the first impurity concentration, and a third semiconductor material between the second semiconductor material and the sidewall of both the channel region and the sub-channel region. The third semiconductor material has a third impurity concentration exceeding the first impurity concentration, but less than the second impurity concentration. The first interconnect metallization levels comprises first contact metallization coupled to a first side of the source region or drain region, the first contact metallization in contact with the second semiconductor material. The second interconnect metallization levels comprises second contact metallization coupled to a second side of the source region or drain region, opposite the first side, the second contact metallization also in contact with the second semiconductor material.

In twelfth examples, for any of the eleventh examples individual ones of the transistor structures are electrically isolated by a dielectric material that is between the sub-channel and the second interconnect metallization levels.

In thirteenth examples, a computing platform comprises the IC of the eleventh examples, and a power supply coupled to the IC of the eleventh examples.

In fourteenth examples, a method of fabricating a transistor structure comprises forming a fin on a substrate comprising a first semiconductor material, defining a channel region of the fin, and exposing at least one end of the fin by etching the first semiconductor material adjacent the channel region to a depth below the channel portion. The method comprises forming a source region and a drain region coupled to the channel region. Forming at least one of the source region and the drain region comprises forming on a sidewall of the channel region a second semiconductor material with a second impurity concentration that is greater than the first impurity concentration, and forming a third semiconductor material over the second semiconductor material, the third semiconductor material having a third impurity concentration exceeding the second impurity concentration. The method of fabricating a transistor structure further comprises forming a first contact metallization coupled to a first side of at least one of the source region or drain region, the first contact metallization in contact with the third semiconductor material. The method further comprises forming a second contact metallization coupled to a second side of at least one of the source region or drain region, opposite the first side, the second contact metallization also in contact with the third semiconductor material.

In fifteenth examples, for any of the fourteenth examples forming the second contact metallization further comprises exposing the third semiconductor by etching through the second semiconductor material at the depth below the channel portion.

In sixteenth examples, for any of the fourteenth through fifteenth examples forming the first contact metallization comprises depositing the first contact metallization in contact with a portion of the third semiconductor material, and forming the second contact metallization comprises depositing the second contact metallization in contact with a portion of the second and third semiconductor materials.

In seventeenth examples, for any of the fourteenth through sixteenth examples depositing the second contact metallization in contact with the portion of the second and third semiconductor materials further comprises depositing the second contact metallization in contact with the third semiconductor material at the depth below the channel portion.

In eighteenth examples, for any of the fourteenth through seventeenth examples defining the channel region of the fin further comprises patterning a gate electrode sidewall spacer. Etching the first semiconductor material on opposite sides of the channel region to the depth below the channel portion comprises etching unprotected portions of the first semiconductor material, the etching undercutting at least a portion of the gate electrode sidewall spacer. Forming the second semiconductor material on the sidewall of the channel region further comprises epitaxially growing the second semiconductor material on a sidewall of the channel region to at least partially backfill the first semiconductor material etched from under the gate electrode sidewall spacer.

In nineteenth examples, for any of the fourteenth through eighteenth examples etching the first semiconductor material on opposite sides of the channel region to the depth below the channel portion comprises etching unprotected portions of a sub-channel semiconductor material at the depth below the channel portion. Forming the second semiconductor material on the sidewall of the channel region further comprises epitaxially growing the second semiconductor material on a sidewall of the sub-channel region.

In twentieth examples, for any of the fourteenth through nineteenth examples forming the fin further comprises etching a monocrystalline substrate layer comprising predominantly silicon.

What is claimed is:

1. A transistor structure, comprising:
a fin comprising a channel region over a sub-channel region, the channel region comprising a first semiconductor material having a first impurity concentration;
a gate electrode adjacent to a sidewall of the channel region, and over a dielectric material that is adjacent to a sidewall of the sub-channel region;
a source region and a drain region on opposite sides of the gate electrode, wherein at least one of the source region and the drain region comprises:
a second semiconductor material that has a second impurity concentration greater than the first impurity concentration; and
a third semiconductor material between the second semiconductor material and the sidewall of both the channel region and the sub-channel region, the third semiconductor material having a third impurity concentration exceeding the first impurity concentration, but less than the second impurity concentration;
first contact metallization coupled to a first side of the source region or drain region, the first contact metallization in contact with the second semiconductor material; and
second contact metallization coupled to a second side of the source region or drain region, opposite the first side, the second contact metallization extending through a thickness of the third semiconductor material and in contact with the second semiconductor material.

2. The transistor structure of claim 1, wherein:
the source region comprises the third semiconductor material between the sidewall of both the channel region and the sub-channel region;
and
a sidewall of the third semiconductor material that is adjacent to the sub-channel region is substantially below a sidewall of a gate spacer that is between a sidewall of the gate electrode and the source region.

3. A transistor structure, comprising:
a fin comprising a channel region over a sub-channel region, the channel region comprising a first semiconductor material having a first impurity concentration;
a gate electrode adjacent to a sidewall of the channel region, and over a dielectric material that is adjacent to a sidewall of the sub-channel region;
a source region and a drain region on opposite sides of the gate electrode, wherein at least one of the source region and the drain region comprises:
a second semiconductor material that has a second impurity concentration greater than the first impurity concentration; and
a third semiconductor material between the second semiconductor material and the sidewall of both the channel region and the sub-channel region, the third semiconductor material having a third impurity concentration exceeding the first impurity concentration, but less than the second impurity concentration;
first contact metallization coupled to a first side of the source region or drain region, the first contact metallization in contact with the second semiconductor material; and
second contact metallization coupled to a second side of the source region or drain region, opposite the first side, the second contact metallization also in contact with the second semiconductor material, wherein:
the first semiconductor material is monocrystalline and comprises predominantly silicon;
the second semiconductor material is in contact with the third semiconductor material; and
the second and third semiconductor materials have crystallinity that is epitaxial with that of the first semiconductor material.

4. The transistor structure of claim 3, wherein:
the second semiconductor material comprises more germanium than the first semiconductor material;
the second and third semiconductor materials are both p-type; and the second and third impurity concentrations comprise p-type impurity dopants.

5. The transistor structure of claim 3, wherein:
the first, second, and third semiconductor materials each comprise predominantly silicon; and
the second and third semiconductor materials are both n-type, the second and third impurity concentrations comprising at least phosphorus.

6. The transistor structure of claim 3, wherein:
the sub-channel region is a portion of a substrate layer; and
the second contact metallization extends through a thickness of the third semiconductor material that is between the second semiconductor material and the substrate layer.

7. The transistor structure of claim 6, wherein the sub-channel region comprises predominantly silicon and has a conductivity type complementary to that of the channel region.

8. The transistor structure of claim 6, wherein:
a sidewall of the second contact metallization is in contact with the second semiconductor material.

9. The transistor structure of claim 8, wherein only the third semiconductor material is between the second contact metallization and the sidewall of the sub-channel region.

10. The transistor structure of claim 8, wherein the third semiconductor material is between the second contact metallization and the sidewall of the channel region.

11. An integrated circuit (IC), comprising:
a plurality of first interconnect metallization levels;
a plurality of second interconnect metallization levels; and
an active device layer between the first and second interconnect metallization levels, the active device layer comprising a plurality of transistor structures, wherein at least one of the transistor structures further comprises:
a fin comprising a channel region over a sub-channel region, the channel region comprising a first semiconductor material having a first impurity concentration;
a gate electrode adjacent to a sidewall of the channel region, and over a dielectric material that is adjacent to a sidewall of the sub-channel region;
a source region and a drain region on opposite sides of the gate electrode, wherein at least one of the source region and the drain region comprises:
a second semiconductor material that has a second impurity concentration greater than the first impurity concentration; and
a third semiconductor material in contact with the sidewall of both the channel region and the sub-channel region, the third semiconductor material having a third impurity concentration exceeding the first impurity concentration, but less than the second impurity concentration, wherein the third semiconductor material is between the second semiconductor material and the sidewall of both the channel region and the sub-channel region;
wherein the first interconnect metallization levels comprise first contact metallization coupled to a first side of the source region or drain region, the first contact metallization in contact with the second semiconductor material; and
wherein the second interconnect metallization levels comprise second contact metallization coupled to a second side of the source region or drain region, opposite the first side, the second contact metallization extending through a portion of the third semiconductor material and in contact with the second semiconductor material.

12. The IC of claim 11, wherein individual ones of the transistor structures are electrically isolated by a dielectric material that is between the sub-channel region and the second interconnect metallization levels.

13. A computing platform, the platform comprising:
the IC of claim 11, and
a power supply coupled to the IC of claim 11.

* * * * *